United States Patent
Lange et al.

(10) Patent No.: US 10,908,649 B2
(45) Date of Patent: Feb. 2, 2021

(54) INTERCHANGEABLE HOUSING COMPONENT FOR PORTABLE COMPUTING DEVICES

(71) Applicant: MICROSOFT TECHNOLOGY LICENSING, LLC, Redmond, WA (US)

(72) Inventors: Paul Raymond Lange, Seattle, WA (US); Michelle Verena Niethammer, Bellevue, WA (US); Ching-Hung Huang, New Taipei (TW); Zhan Ding, Lake Forest Park, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/417,226

(22) Filed: May 20, 2019

(65) Prior Publication Data
US 2020/0371559 A1    Nov. 26, 2020

(51) Int. Cl.
*G06F 1/16* (2006.01)
*H05K 5/02* (2006.01)
*H05K 5/03* (2006.01)

(52) U.S. Cl.
CPC .......... *G06F 1/1656* (2013.01); *G06F 1/1618* (2013.01); *H05K 5/0221* (2013.01);
(Continued)

(58) Field of Classification Search
CPC ... G06F 1/1656; H05K 5/0239; H05K 5/0243
See application file for complete search history.

(56) References Cited

U.S. PATENT DOCUMENTS

| 5,768,370 A * | 6/1998 | Maatta | H04M 1/0283 |
| | | | 379/433.01 |
| 6,430,644 B1 * | 8/2002 | Luen | G06F 1/181 |
| | | | 361/726 |

(Continued)

FOREIGN PATENT DOCUMENTS

| CN | 102317931 A | 1/2012 |
| CN | 104699275 A | 6/2015 |
| JP | 3166436 U | 3/2011 |

OTHER PUBLICATIONS

"DataGrid Library for jQuery", Retrieved from: https://www.syncfusion.com/jquery/javascript-ui-controls/datagrid, Retrieved Date: Apr. 1, 2019, 12 Pages.
(Continued)

*Primary Examiner* — Abhishek M Rathod
*Assistant Examiner* — Keith DePew
(74) *Attorney, Agent, or Firm* — NovoTechIP International PLLC

(57) ABSTRACT

Interchangeable housing panel components for a display housing of a portable computing device. The interchangeable housing panel component is sized and dimensioned to be received by a receiving portion of the computing device. A first interchangeable housing panel component is quickly installed by a user to customize the appearance of their computing device and, when desired, is also quickly removed, from the computing device. A second interchangeable housing panel component can then be installed on the same computing device, transforming the appearance of their computing device. When desired, the second interchangeable housing panel component can be removed and the first interchangeable housing panel component can be reinstalled, returning the computing device to its previous appearance. The housing panel components and computing (Continued)

device include provisions for easy removal and installation of the components.

25 Claims, 22 Drawing Sheets

(52) U.S. Cl.
CPC ......... *H05K 5/0239* (2013.01); *H05K 5/0243* (2013.01); *H05K 5/0256* (2013.01); *H05K 5/03* (2013.01)

(56) References Cited

U.S. PATENT DOCUMENTS

| | | | | |
|---|---|---|---|---|
| 6,463,262 | B1* | 10/2002 | Johnson | H04M 1/0237 |
| | | | | 379/433.01 |
| 6,625,425 | B1* | 9/2003 | Hughes | H01M 2/1066 |
| | | | | 455/351 |
| 6,771,492 | B2* | 8/2004 | DeLuga | G06F 1/1616 |
| | | | | 312/223.1 |
| 7,000,181 | B2 | 2/2006 | Press | |
| 7,197,345 | B2* | 3/2007 | Kim | H04M 1/0214 |
| | | | | 455/575.1 |
| 7,775,355 | B1* | 8/2010 | Hood | G06F 1/181 |
| | | | | 206/320 |
| 7,876,550 | B1* | 1/2011 | Albertini | G06F 1/1626 |
| | | | | 206/320 |
| 7,930,011 | B2* | 4/2011 | Shi | H05K 5/0243 |
| | | | | 206/320 |
| 7,998,557 | B2* | 8/2011 | Chen | H05K 5/0243 |
| | | | | 150/120 |
| 8,644,009 | B2* | 2/2014 | Rylski | H05K 5/0243 |
| | | | | 361/679.01 |
| 8,681,485 | B2* | 3/2014 | Du | H05K 5/0243 |
| | | | | 361/679.02 |
| 8,920,903 | B2* | 12/2014 | Liang | H05K 5/0243 |
| | | | | 312/223.1 |
| 9,288,304 | B2 | 3/2016 | Lin et al. | |
| 9,468,111 | B2* | 10/2016 | Yin | H05K 5/006 |
| 9,578,757 | B2* | 2/2017 | Jacobs | G06F 1/181 |
| 10,123,439 | B1* | 11/2018 | Lin | H05K 5/0243 |
| 10,218,828 | B2 | 2/2019 | Haymond | |
| 2002/0044408 | A1* | 4/2002 | DeLuga | G06F 1/1656 |
| | | | | 361/679.26 |
| 2002/0197965 | A1* | 12/2002 | Peng | H04B 1/3888 |
| | | | | 455/575.1 |
| 2003/0134613 | A1* | 7/2003 | Latto | H05K 5/0243 |
| | | | | 455/347 |
| 2005/0187784 | A1* | 8/2005 | Bander | G06F 1/1656 |
| | | | | 705/1.1 |
| 2008/0019089 | A1 | 1/2008 | Chi et al. | |
| 2008/0174946 | A1* | 7/2008 | Chen | G06F 1/181 |
| | | | | 361/679.57 |
| 2012/0326575 | A1* | 12/2012 | Hirota | G06F 1/1601 |
| | | | | 312/7.2 |
| 2013/0021728 | A1 | 1/2013 | Yamamoto et al. | |
| 2013/0078416 | A1* | 3/2013 | Liang | H05K 5/0243 |
| | | | | 428/100 |
| 2013/0210317 | A1* | 8/2013 | Hageman | G06F 1/1626 |
| | | | | 446/396 |
| 2014/0091688 | A1* | 4/2014 | Narajowski | H05K 5/0247 |
| | | | | 312/223.6 |
| 2015/0061475 | A1* | 3/2015 | Fairchild | H05K 5/0221 |
| | | | | 312/223.1 |
| 2017/0068272 | A1 | 3/2017 | Loscalzo | |
| 2017/0139894 | A1 | 5/2017 | Welch | |
| 2017/0220070 | A1 | 8/2017 | Clark | |

OTHER PUBLICATIONS

"Enable DataGrid Inline Editing", Retrieved from: https://web.archive.org/web/20110611013158/https://www.jeasyui.com/tutorial/datagrid/datagrid12.php, Jul. 11, 2011, 2 Pages.

"How to Change Inspiron Lids in 99 Seconds", Retrieved from: https://www.youtube.com/watch?v=b9LVJKyr8U8, Feb. 28, 2013, 5 Pages.

"Inline Editing of Tables in WordPress", Retrieved from: https://wpdatatables.com/documentation/front-end-editing/inline-editing/, Retrieved Date: Apr. 1, 2019, 3 Pages.

"Reactive Forms", Retrieved from: https://www.telerik.com/kendo-angular-ui/components/grid/editing/editing-reactive-forms/#toc-basic-concepts, Retrieved Date: Apr. 1, 2019, 5 Pages.

"International Search Report and Written Opinion Issued in PCT Application No. PCT/US20/027814", dated Aug. 25, 2020, 18 Pages.

* cited by examiner

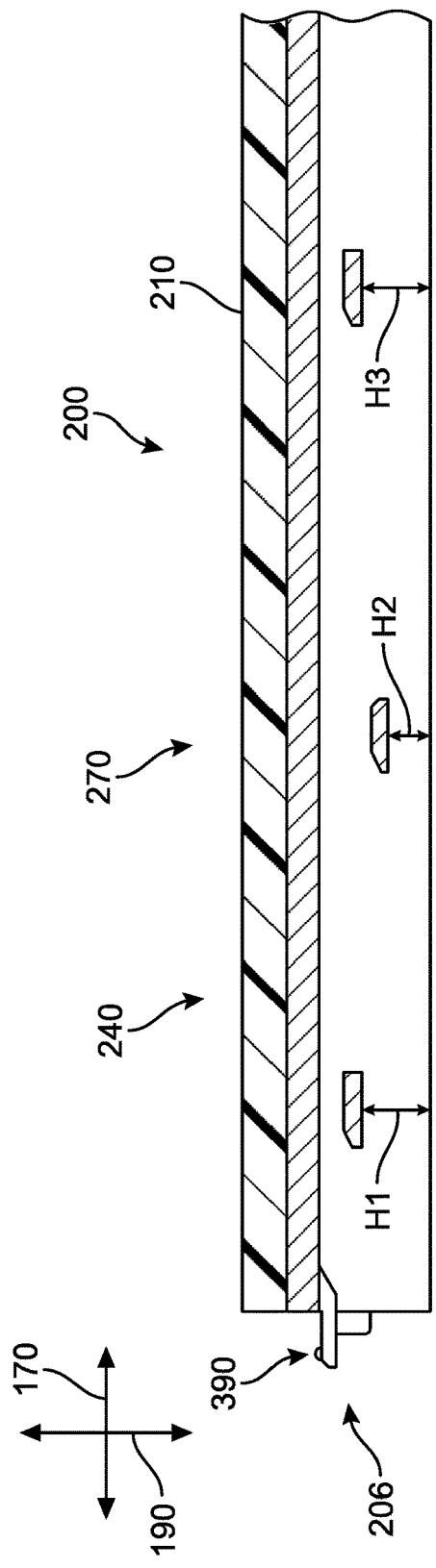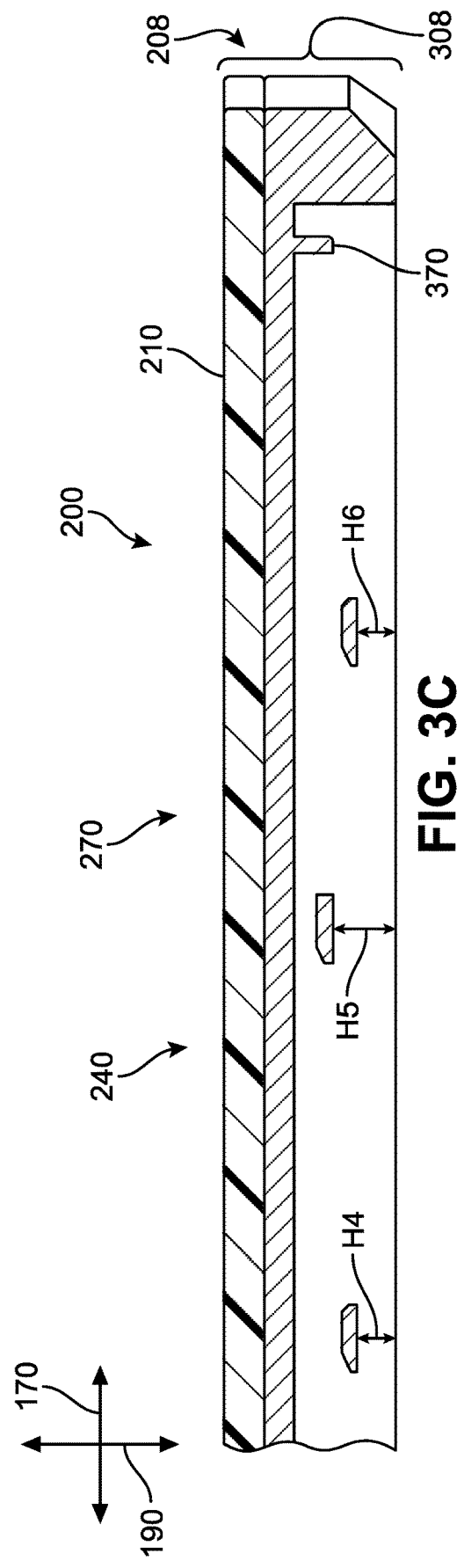

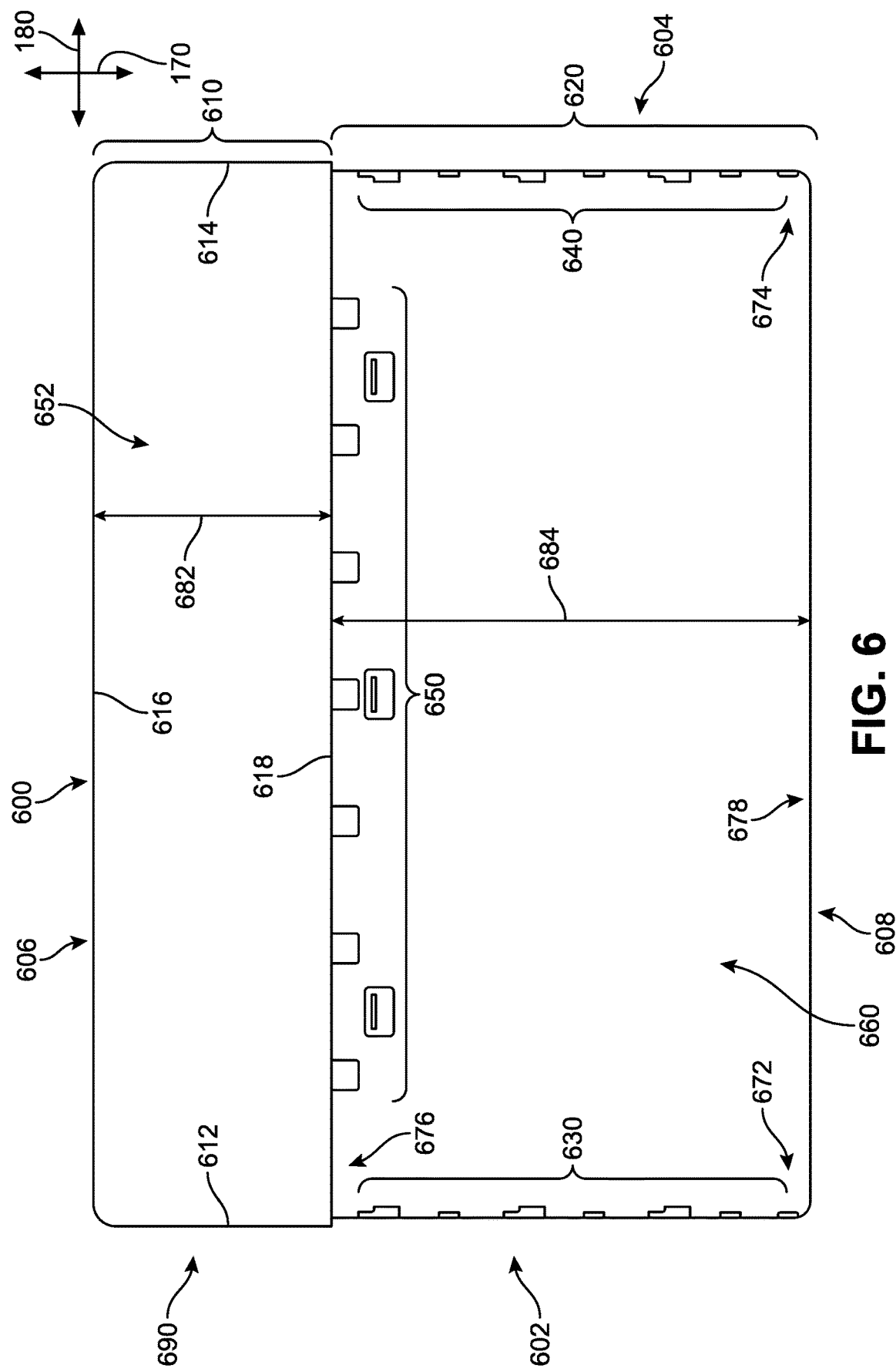

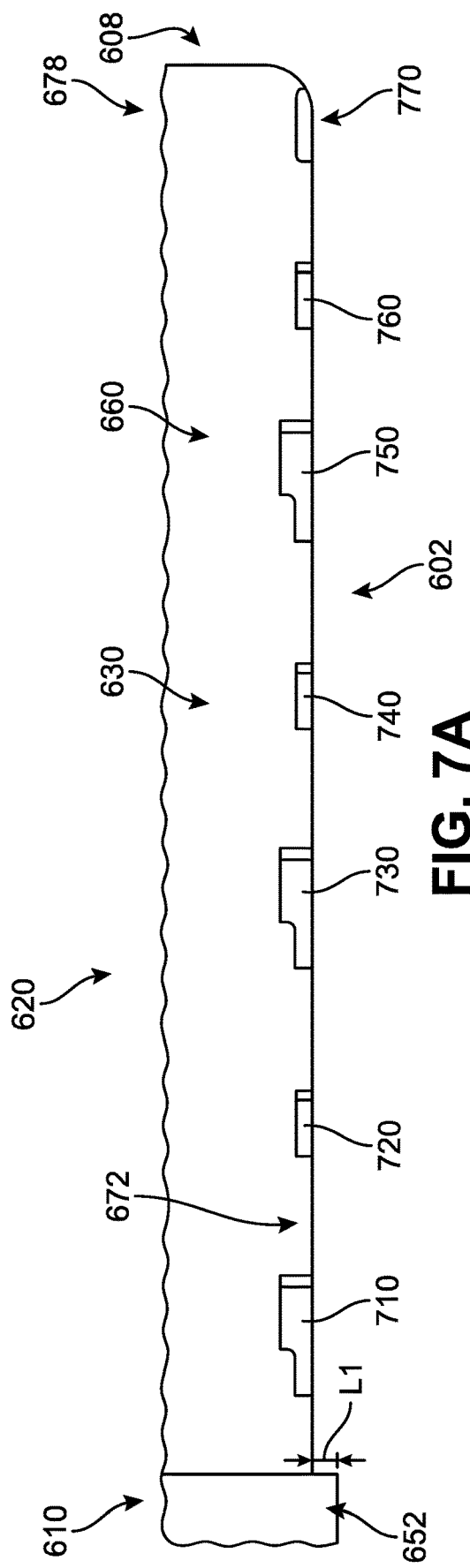
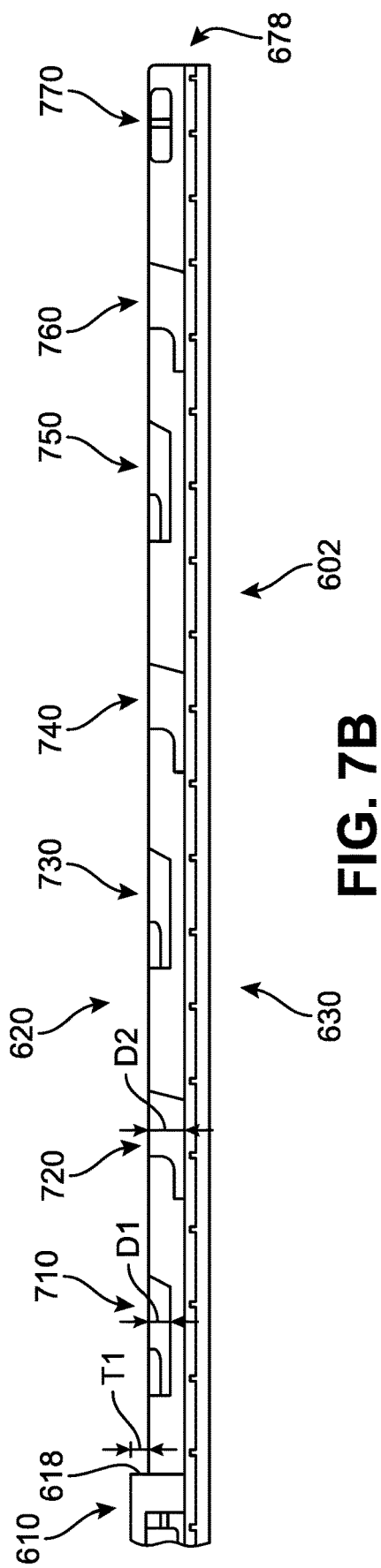
FIG. 7A
FIG. 7B

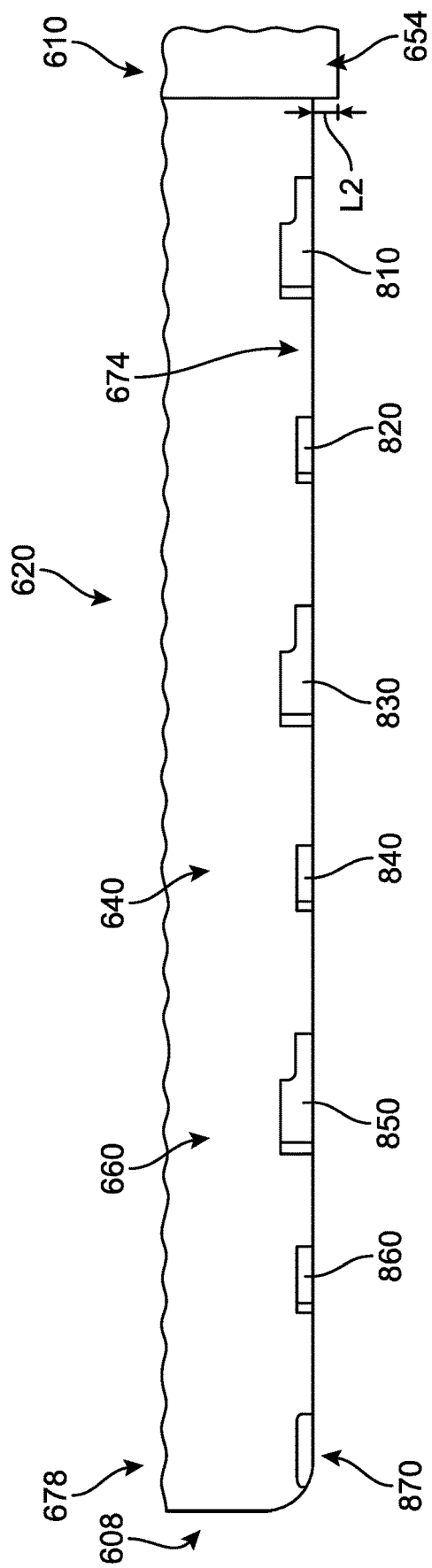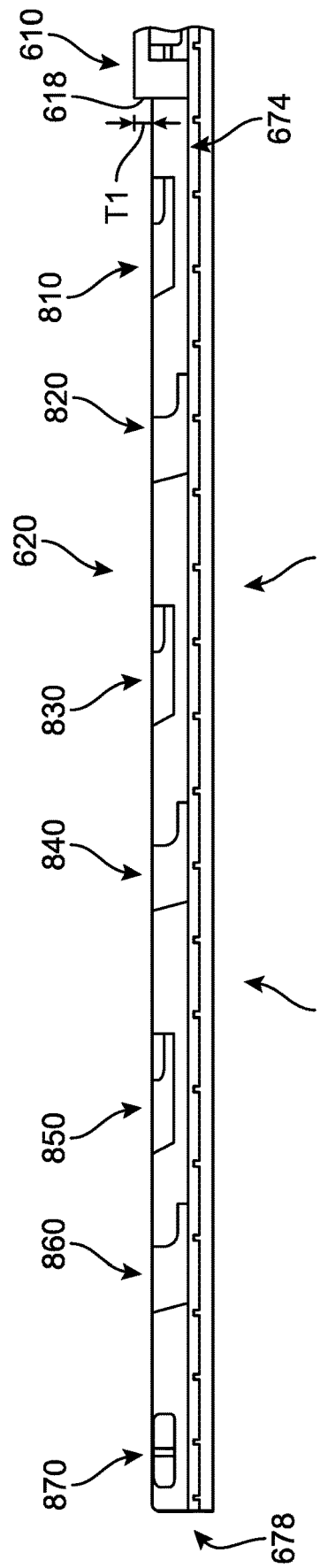

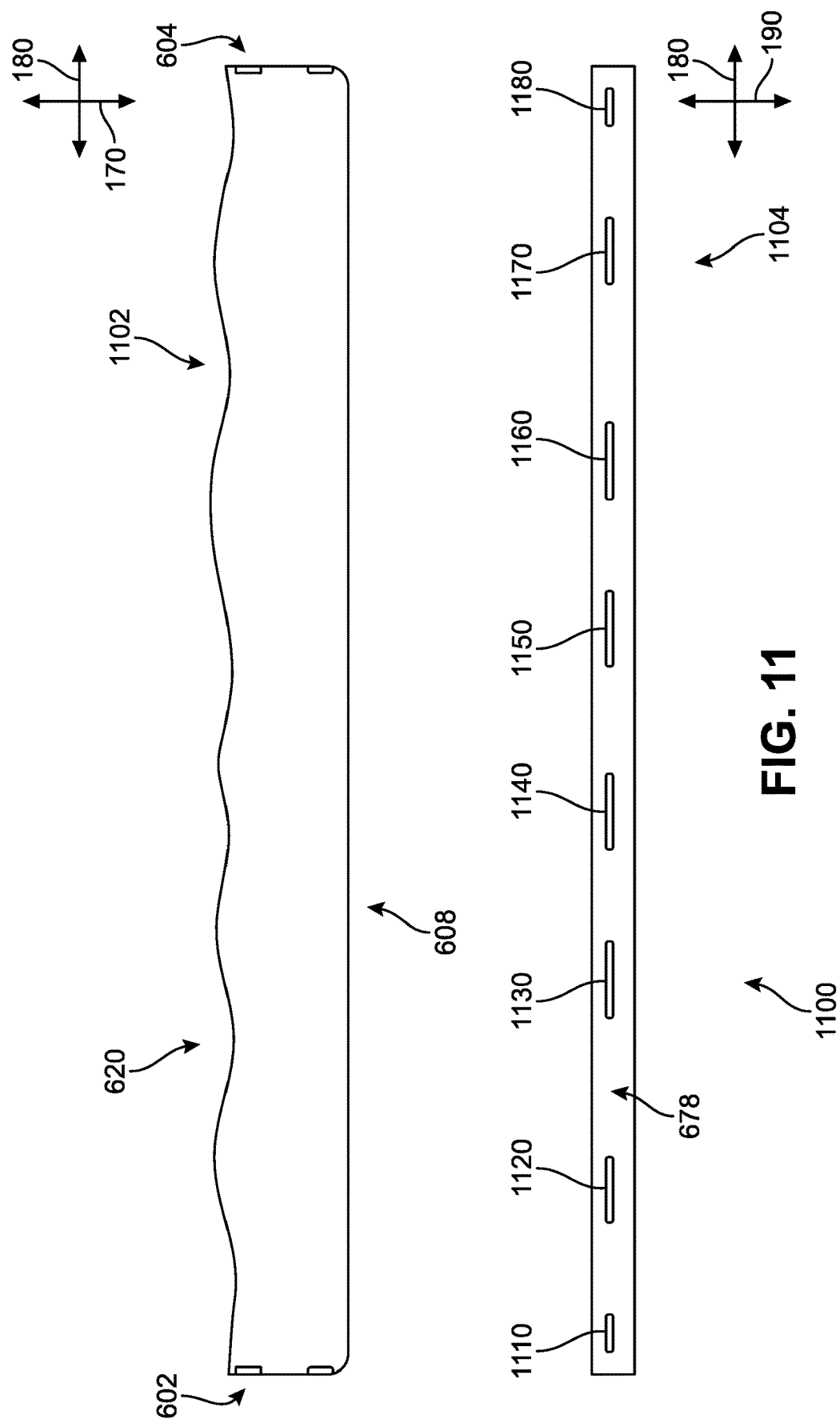

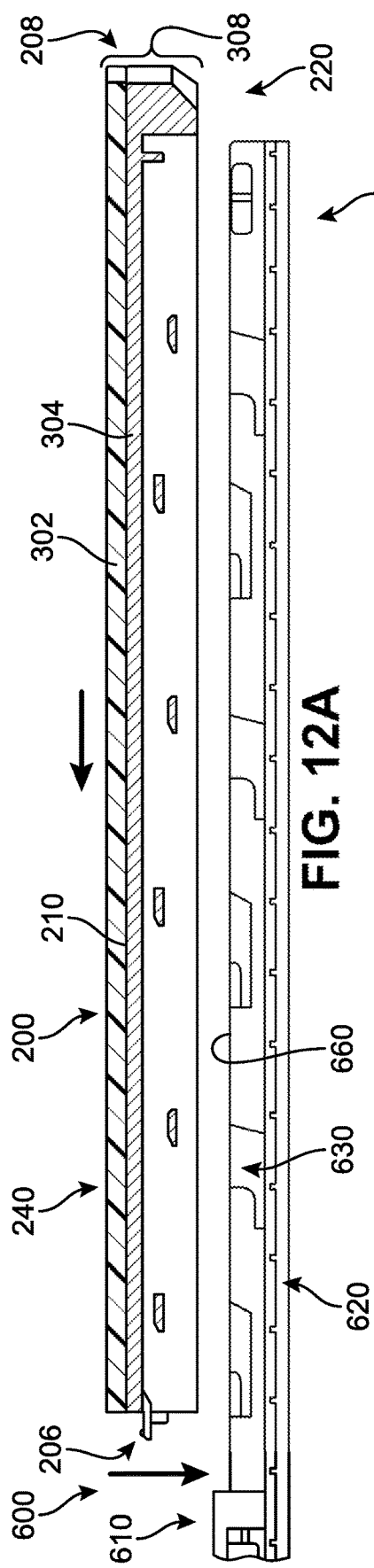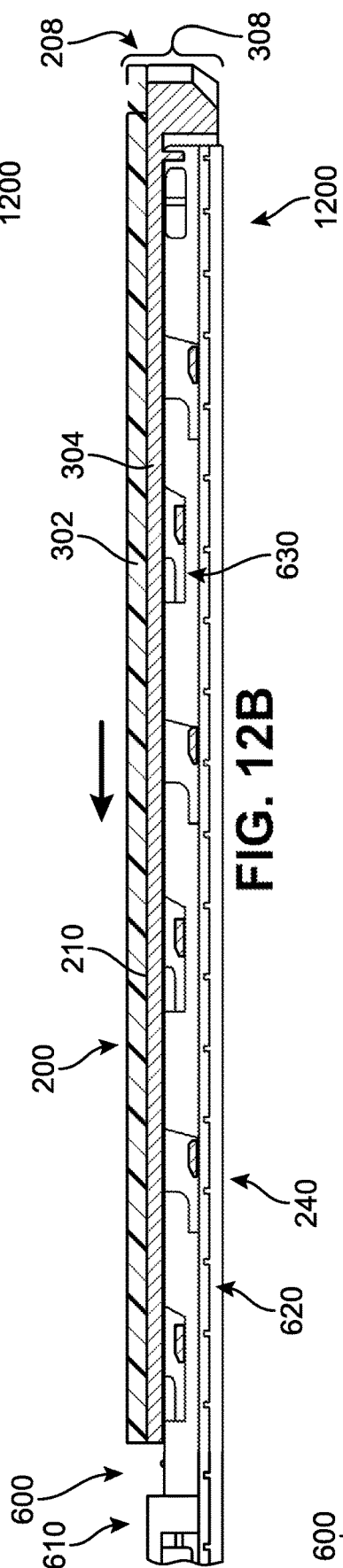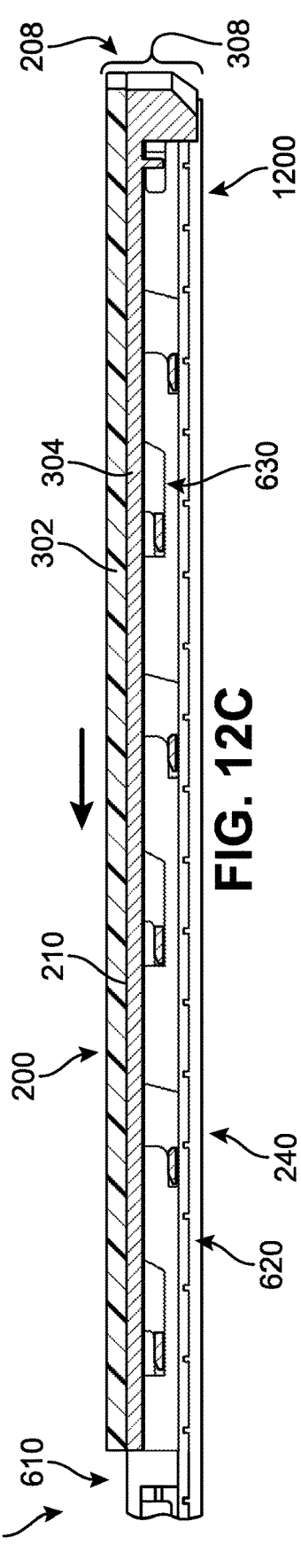

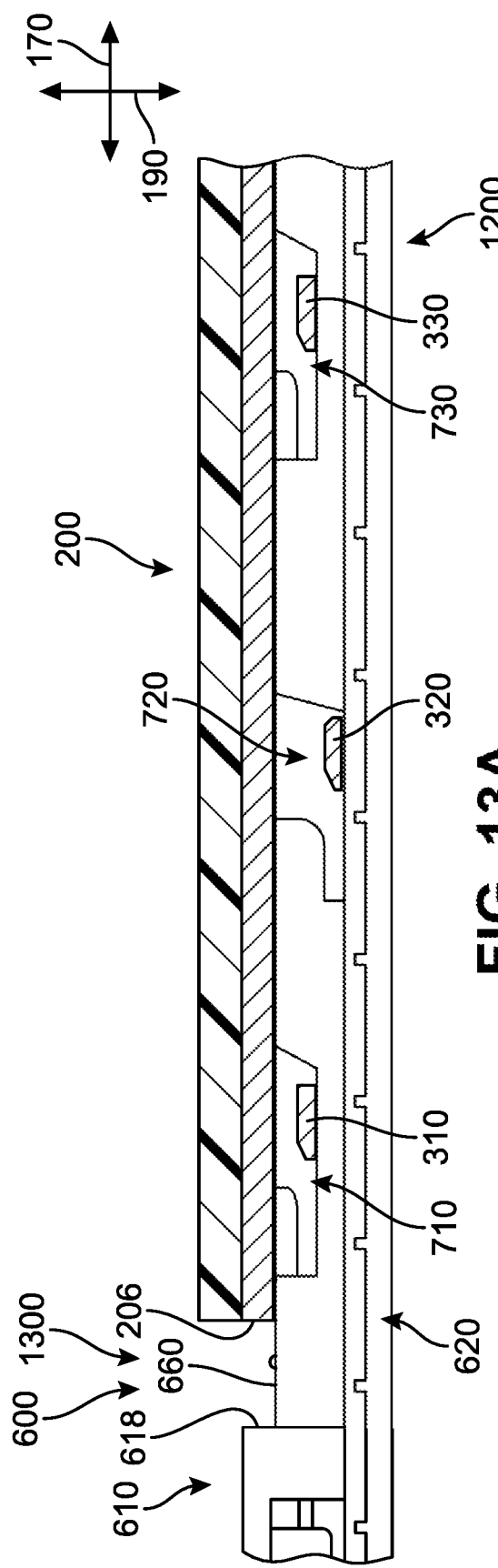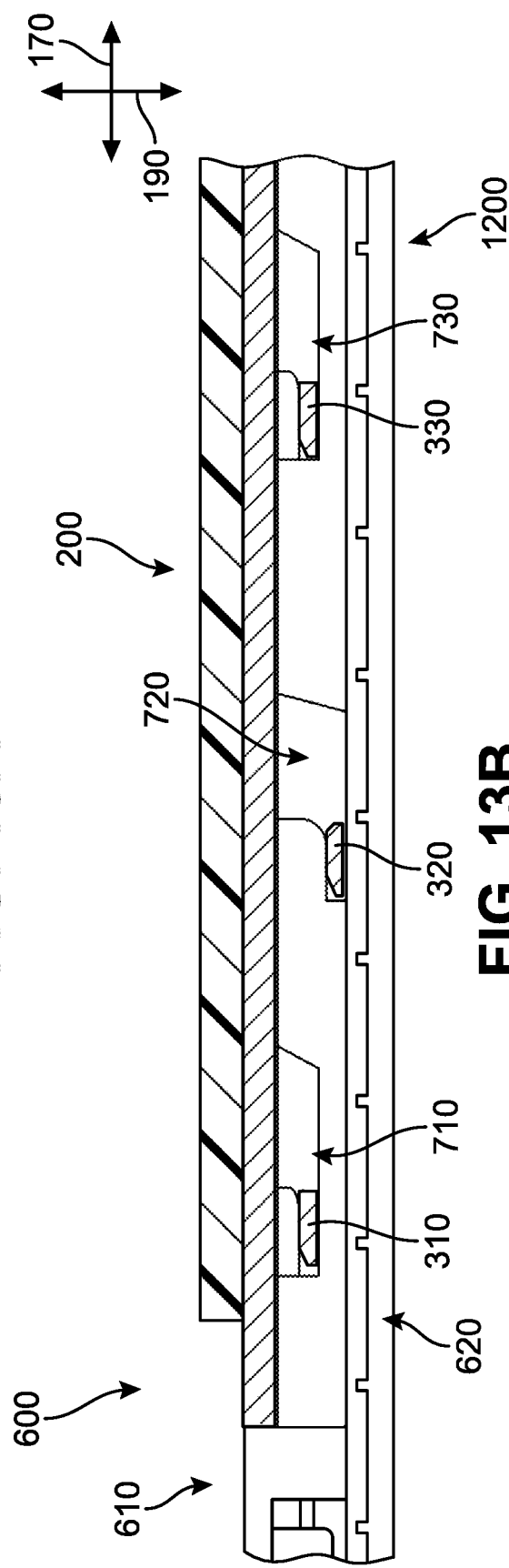

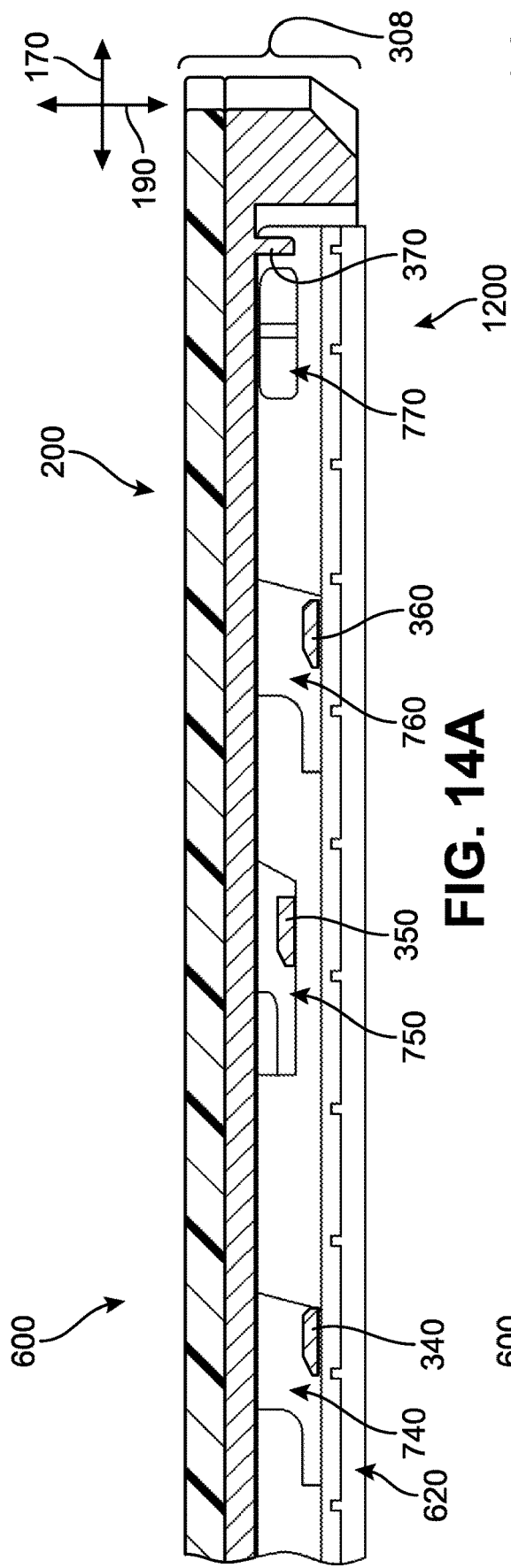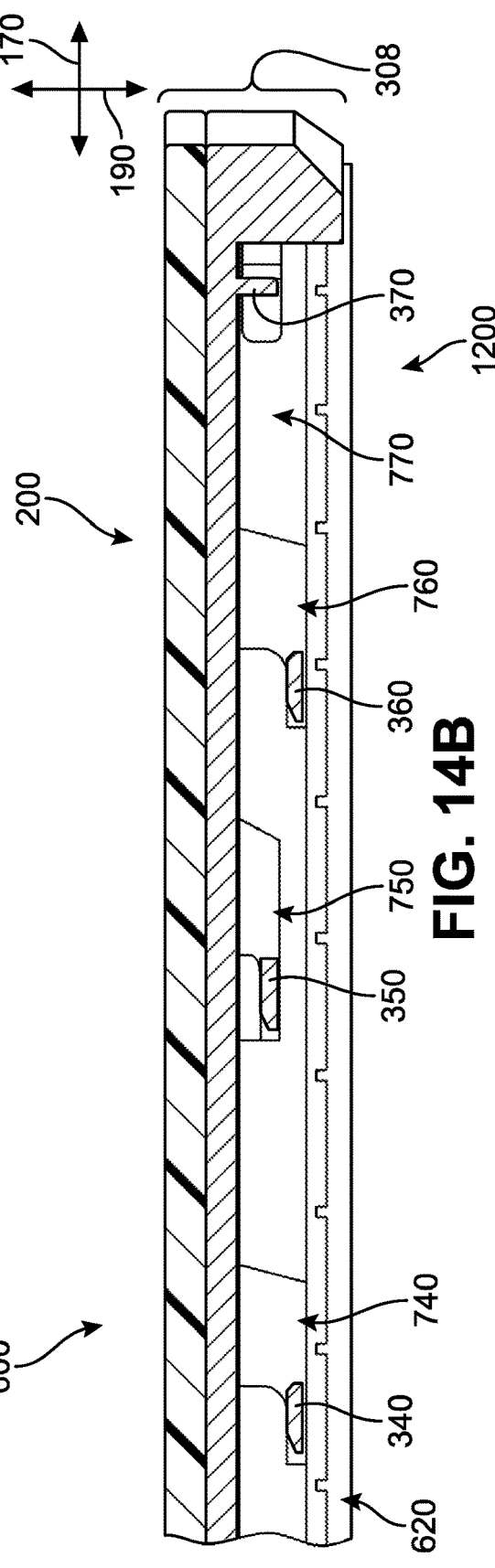

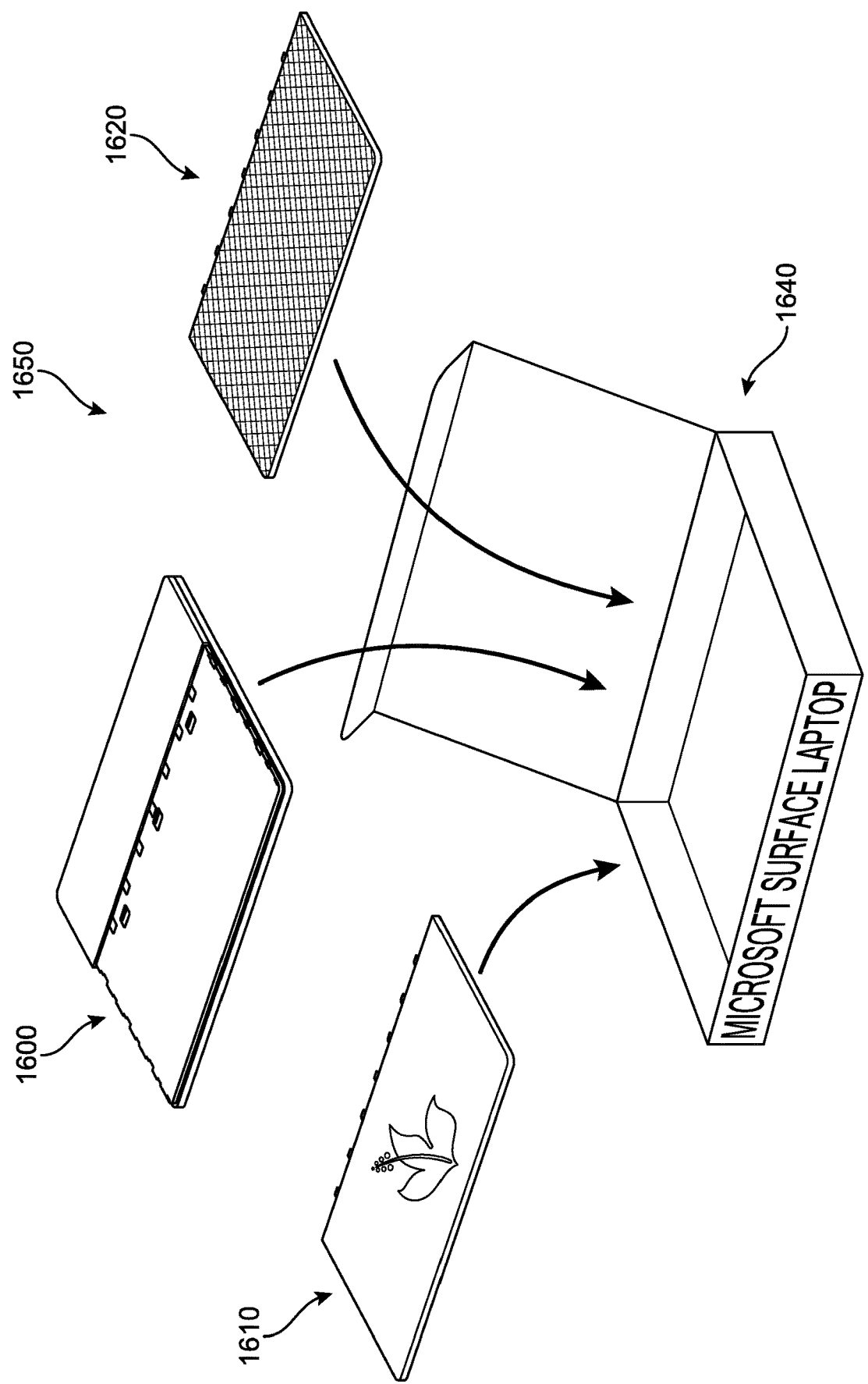

INTERCHANGEABLE HOUSING COMPONENT FOR PORTABLE COMPUTING DEVICES

BACKGROUND

Electronic devices such as computing devices typically include housing that provides an external surface to the device. As these devices become increasingly common, more and more users are seeking to personalize the outer appearance of their personal devices. Laptops and other mobile devices, despite being useful for individual user communications and self-expression, are often desired as an accessory item to add to or change the aesthetic of a person's ensemble or as an extension of their own appearance. Indeed, it is often desirable to have laptops with different appearances for different occasions (e.g., school, work, home, meetings, social events, etc.). It can be a challenge, however, for a person to purchase multiple laptops sufficient to suit a number of different unique choices. For example, simply the cost of purchasing a single computing device can be prohibitive for some.

Users attempt to personalize their devices by application of adhesives, external covers, sleeves, printing, or other modifications to the device appearance. These efforts usually result in a device that is appropriate for one type of setting, but not others, which can be frustrating to users and discourage the otherwise desired personalization of their device. For example, purchasing and applying stickers on a device can cause other logistical issues when the stickers need to be removed. Similarly, when a user desires to effect a change in external appearance of their device for whatever reason (e.g., change in environment, outfit, etc.), the user may need to spend time removing the previous personalization items, typically leaving behind residue that needs to be cleaned, as well as destroying the value of the personalization items as they are extracted from the surface of the device. Often when trying to alter the device's appearance, scratches or other damage to the device can occur. This can result in various levels of inconvenience and annoyance, and can deter a user from modifying the appearance of their laptop to gain a desired aesthetic.

Although some mechanisms for altering the appearance of a computing device exist, most such mechanisms tend to be ineffective and inconvenient. For example, these mechanisms can be bulky, expensive, and difficult to implement. Such mechanisms can be also be obvious, and can diminish the intended aesthetics, and in some cases even the function, of the resultant device's external appearance. Furthermore, once a user makes a modification, or purchases a device with a particular appearance, further alterations can be complicated and frustrating. Due to these and other inconveniences, an end-user may ultimately forego changing the device cover. Thus, there remain significant areas for new and improved ideas for offering device appearance personalization options in a way that meets the needs of today's users as they transition between one activity and the next with the awareness that their devices provide an important extension to their own aesthetic ensemble and self-expression.

SUMMARY

An interchangeable housing component for a portable computing device, in accordance with a first aspect of this disclosure, has a body portion including an upper surface, an opposite-facing lower surface, and a forward edge, a rearward edge, a first side edge, and a second side edge. The interchangeable housing component also includes a first sidewall extending outward from the first side edge of the body portion, and a second sidewall extending outward from the second side edge of the body portion. In addition, a first set of raised portions protrude from a first interior surface of the first sidewall, and a second set of raised portions protrude from a second interior surface of the second sidewall, where the first interior surface and the second interior surface face toward one another.

A kit of parts, in accordance with a second aspect of this disclosure, includes a portable computing device with a display housing with a first side and an opposite-facing second side, the first side including a base portion and a receiving portion that is recessed relative to the base portion, the second side including a display panel. The kit of parts also includes a first interchangeable housing component sized and dimensioned to be removably attached to the receiving portion, the first interchangeable housing component including a body portion with an upper surface and an opposite-facing lower surface, and a U-shape sidewall extending around three sides of the body portion. In addition, the receiving portion includes an interface surface that is exposed until the first interchangeable housing component is removably attached to the display housing.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

FIGS. 3A-3C are side-views of an implementation of a sidewall of the first housing panel component comprising a set of raised portions;

FIG. 6 is a top-down view of a display housing for a portable computing device;

FIG. 7A is a top-down view of a first periphery of a receiving portion for the portable computing device, and FIG. 7B is a side view of the first periphery depicting grooves configured to receive raised portions of a housing panel component;

FIG. 8A is a top-down view of a second periphery of a receiving portion for the portable computing device, and FIG. 8B is a side view of the second periphery depicting grooves configured to receive raised portions of a housing panel component;

FIG. 11 is an isolated view of a fourth periphery of the receiving portion including a plurality of apertures;

FIGS. 12A-12C are a sequence of drawings illustrating an example of the installation process of a housing panel component with a display housing of a device;

FIGS. 13A and 13B depict an enlarged isolated view of a rear portion of a housing panel component and a rear portion of a display housing during the installation process;

FIGS. 14A and 14B depict an enlarged isolated view of a forward portion of a housing panel component and a forward portion of a display housing during the installation process;

FIG. 16 is an isometric view of an example of a kit of parts with two interchangeable housing panel components.

DETAILED DESCRIPTION

Figure 1A:
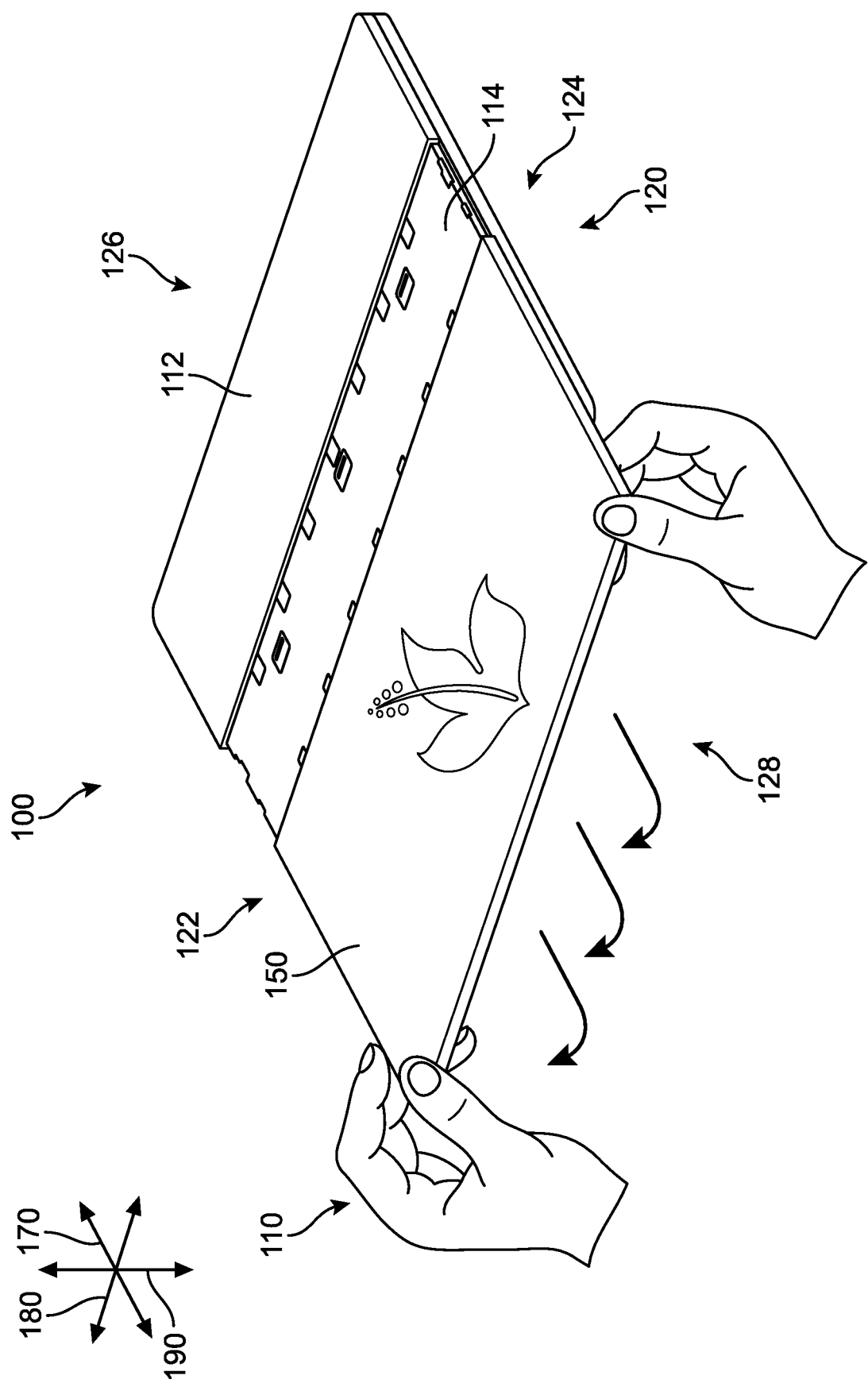
FIGS. 1A-1E are a sequence of drawings illustrating an example of a computing device and a pair of interchangeable housing panel components.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings. In the following material, indications of direction, such as "top" or "left," are merely to provide a frame of reference during the following discussion, and are not intended to indicate a required, desired, or intended orientation of the described articles.

Computing devices such as tablet computers, laptops, and other smart devices have been increasingly moving toward an all-day everyday reliance by end-users, where users carry their devices through their normal routines and activities, similar to a handbag or wallet. However, this trend is associated with challenges, as these devices can be viewed as reflections of the user's personal tastes and outlook. In a work meeting for example, a user may wish to interact with a well-kept, professional, or otherwise sharp-looking device, while at social events occurring the same day, the same user may wish their device to clearly showcase their interests, preferences, and/or favorite subjects. As noted above, there is a need for such devices to readily adapt to modifications in appearance. The following description discloses systems and methods for providing users with simple, quick, and easy to implement changes to device appearance. In different implementations, the following systems can provide a relatively simple means of switching the appearance of their device from a first 'costume' to a second 'costume' while retaining the integrated, seamless feel of the device as a whole. Specifically, an easy-to-remove-and-replace reusable housing panel component for a computing device will be described. For example, a first component with a first appearance and properties can be detached from an external surface of the computing device, and a second component with a second appearance and properties can be attached to the same computing device, such that the appearance of the computing device is substantially altered. The device can also be quickly returned to its original appearance. In addition, the device can be configured to receive a plurality of different components and, with each new attachment (or re-attachment), appear to become for all intents and purposes a different device. Such appearance swaps can allow a user to enjoy the benefit of a single device with the ability to rapidly morph in appearance to better reflect the user's expectations across a wide range of occasions. Furthermore, this type of arrangement allow the user to more readily express individuation, art, or advertising that is functional, removable, and compatible with the computer's functions, screen visibility, ability to close, and ability to be transported with ease.

It should be understood that while the following implementations will be described in the general context of a laptop computer, the systems may be applicable to numerous other electronic devices such as PDAs, MP3 players, remote controls, gaming interfaces, digital cameras, mobile phones, tablets, and other computer related devices such as flat panel monitors, computer monitors, medical devices, point of sale terminals, and other relatively man-portable or mobile computing devices.

The following description presents interchangeable housing systems for use with computing devices. In order to better introduce the systems and methods to the reader, FIGS. 1A-1E present a high-level example of a representative system 100 providing an interchangeable housing component for a portable computing device ("device") 120. FIG. 1A depicts one implementation of the device 120 that includes a display housing that has an outer or external upper section (first side) comprising a base portion 112 and an adjacent receiving portion 114. In this case, the device 120 includes a first component 150 that serves as a portion of the larger housing for the lid (e.g., the display unit) of the device 120, where the lid contains or houses a display panel for the device 120, and is joined (for example, by a hinge or other pivoting connection mechanism) to a keyboard and/or main body unit of the computing device. Additional description related to some portable computing devices can be found in U.S. Patent Publication Number 2008/0239641 to Sato et al., entitled "Method of Manufacturing Electronic Apparatus, Electronic Apparatus, and Subassembly Product" published on Oct. 2, 2008, the disclosure of which is herein incorporated by reference in its entirety.

In some implementations, the receiving portion 114 is recessed relative to the base portion 112, and is also configured to receive and secure an additional component (here, an interchangeable housing panel component). In different implementations, the receiving portion 114 can be sized and dimensioned to receive and/or be detached from an interchangeable housing component. In some implementations, the device 120 will not appear 'complete' or fully assembled until a candidate housing panel component is also secured to the receiving portion and covers the exposed region. The sequence of FIGS. 1A-1E present one example of a process in which a first housing component installed on the device 120 is replaced by a second, different housing component. The display housing of the device 120 also includes an opposite-facing second side that can support, frame, contain, enclose, and/or house the display panel for the computing device. In other words, the first side of the display housing comprises the backside or rear structure of the display panel for the device. Thus, although the drawings do not illustrate in detail the display panel, it is to be understood that all computing devices described herein include a computing display-screen panel. The interchangeable housing panel components refers to candidate housing cover components that may be installed on the display housing that is supporting, surrounding, enclosing and/or containing an integrated display panel for viewing content being displayed by the device (such as a lid for a laptop or notebook computing device).

In FIG. 1A, a first component 150 is being pulled or slid distally outward by a user 110 (e.g., toward the body of the user 110), or along a direction moving away from the device 120 that is generally aligned with a lateral axis 170. In some cases, the user 110 may first exert a gentle downward pressure on the first component 150 (i.e., in a downward direction generally aligned with a vertical axis 190) prior to or as the first component 150 is slid away from the device 120 in order to facilitate release of the first component 150 from the attachment mechanisms that were securing the first component 150 to the receiving portion 114 of the device 120. In another example, the user 110 may exert a gentle inward or proximal pressure on the first component 150 (i.e., in a downward pressing in towards the center of the component) prior to or as the first component 150 is slid away from the device 120 in order to facilitate release of the first component 150 from the attachment mechanisms that were securing the first component 150 to the receiving portion 114 of the device 120. Once the first component 150 is loosened or detached from the device 120, it may be pulled upward as well to fully remove or uninstall the housing component, revealing or exposing an outer surface of the receiving portion 114.

For consistency and convenience, some directional adjectives are employed throughout this detailed description corresponding to the illustrated embodiments. The term "longitudinal" as used throughout this detailed description and in the claims refers to a direction extending a length of a component. For example, the longitudinal direction of the first component 150 and/or device 120 may extend between a first side 122 and a second side 124. Also, the term "lateral" as used throughout this detailed description and in the claims refers to a direction extending along a width of a component. For example, the lateral direction of the first component 150 and/or device 120 may extend between a rearward side 126 and a forward side 128. Additionally, the term "vertical" as used throughout this detailed description and in the claims refers to a direction that is perpendicular to both the longitudinal and lateral directions. For example, the vertical direction of sole system 110 may extend through the thickness of the first component 150 and/or device 120. In addition, the term "proximal" refers to a portion of a component that is closer to a central region of the component. Likewise, the term proximal direction refers to a direction oriented towards the central region. The term "distal" refers to a portion of a component that is further from the central region. The distal direction refers to a direction oriented away from the central region. As used herein, the "central region" could be the center of mass and/or a central plane and/or another centrally located reference surface of the component or device.

Figure 1B:
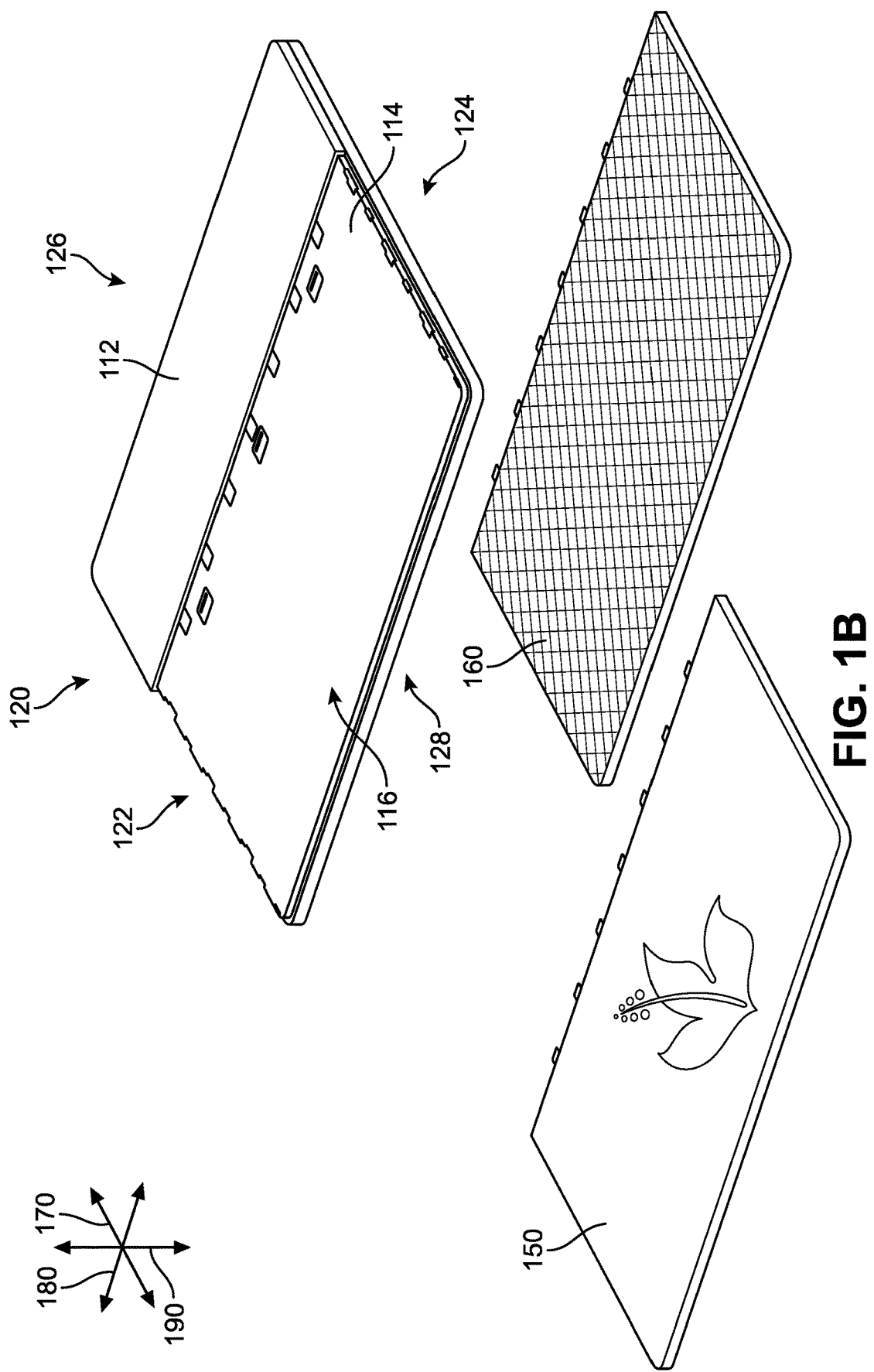

In FIG. 1B, the first component 150 has been removed from the device 120, and the receiving portion 114 now presents an exposed surface 116 that was previously disposed beneath, adjacent to, facing toward and/or contacting the lower surface or underside of the first component 150. In addition, a second component 160 is also introduced, with similar proportions to the first component 150. However, it may be understood that although the first component 150 and the second component 160 can include similar fastening or attachment mechanisms (as will be described in greater detail herein), each component can otherwise differ greatly in appearance, material composition, and other physical or structural properties. Simply as an example, the first component 150 may comprise a rigid external material that is hard to the touch, while the second component 160 may comprise a fabric, or other more compressible or elastic material. In another example, the first component 150 may include a printing, tint, logo, or other artistic illustration or ornamentation, while the second component 160 includes embroidery or different textile-based designs and/or patterns (or vice-versa).

Figure 1C:
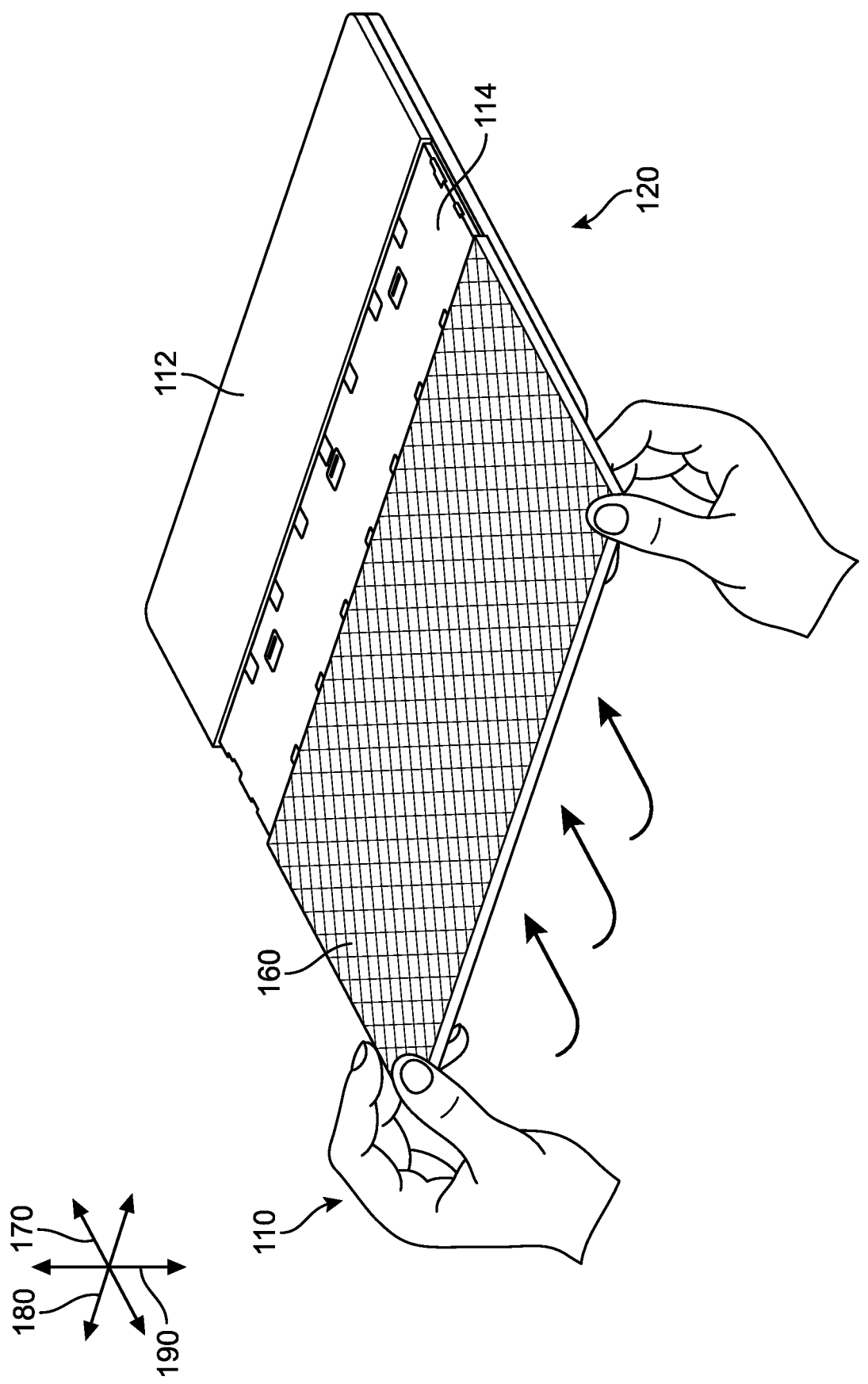

In FIG. 1C, an installation or attachment stage is depicted, in which the second component 160 is now being slid or otherwise connected with the device 120. The second component 160 may be an entirely new component (i.e., has never been used with this device before) or may be a component that was previously attached to this device but was removed and is now being re-used. In this example, the second component 160 is being pushed or slid onto the receiving portion 114 by the user 110 in a direction away from the body of the user 110, or along a direction toward the device 120 that is generally aligned with a lateral axis 170. In some cases, the user 110 may also exert a gentle downward pressure on the second component 160 (i.e., in a downward direction generally aligned with a vertical axis 190) prior to or as the second component 160 is slid onto or toward the device 120 in order to facilitate a latching or secure receipt of the second component 160 via the same or substantially similar attachment mechanisms that were securing the first component 150 to the receiving portion 114 of the device 120 earlier.

Figure 1D:
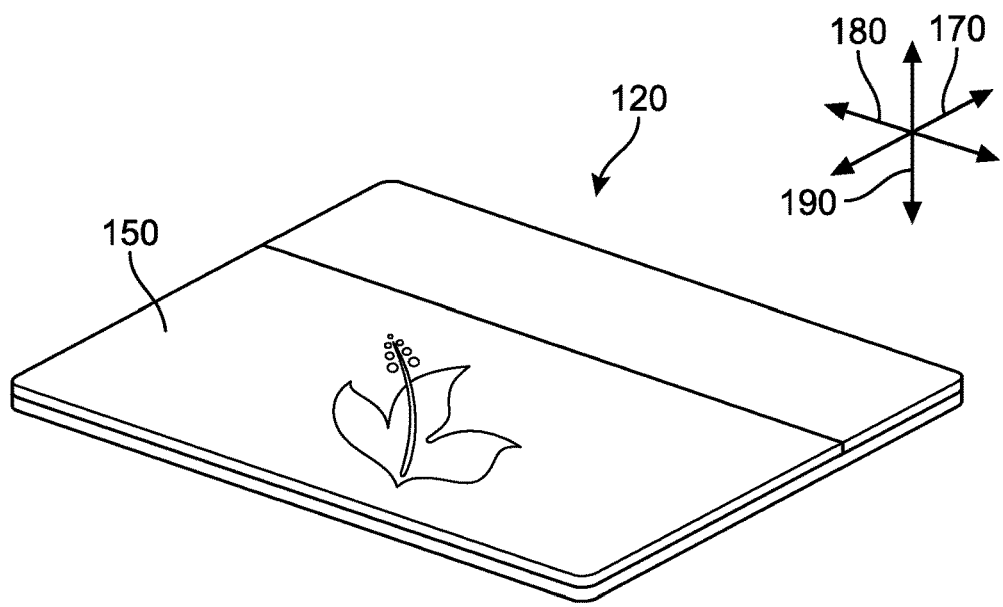
Figure 1E:
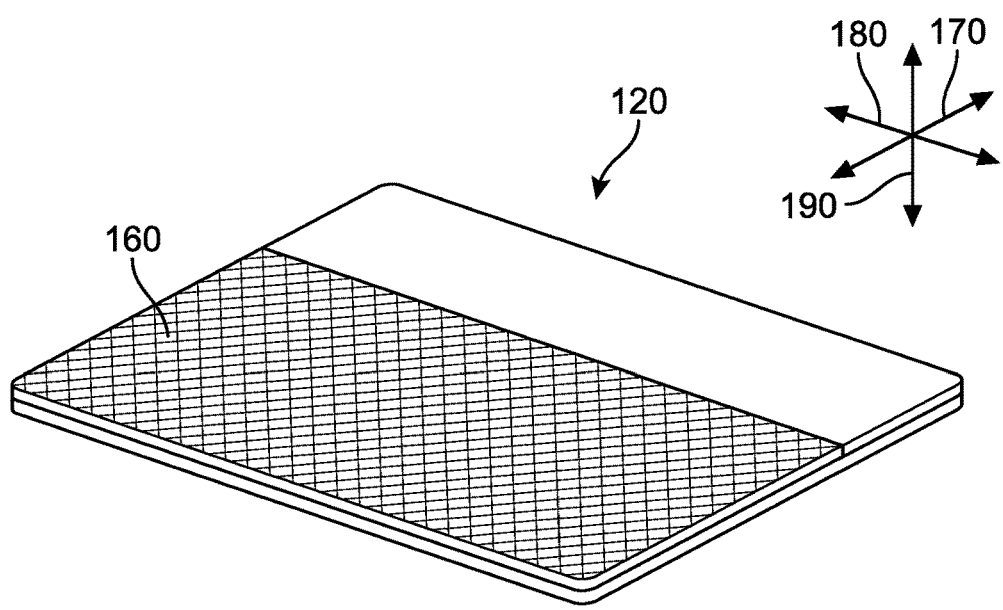

Thus, as will be described in greater detail below, a display housing of the device 120 can be configured to receive and integrate multiple types of display housing components that can significantly affect the external appearance of the device. In other words, there can be a plurality of interchangeable housing components that can each be removably or releasably attached to the device. For purposes of comparison, FIG. 1D depicts the device 120 with the first component 150 installed and FIG. 1E depicts the device 120 with the second component 160 installed, each being associated with a different outer appearance that can be suitable for different types of events or occasions.

As a general matter, the phrase "removably attached" or interchangeable refers to components that are designed for repeated installation and removal. Thus, "removably attached" shall refer to the joining of two components in a manner such that the two components are secured together, but may be readily detached from one another, and again secured together if so desired. Non-limiting examples of removable attachment mechanisms may include hook and loop fasteners, friction fit connections, interference fit connections, threaded connectors, cam-locking connectors, and other such readily detachable connectors. Similarly, "removably disposed" shall refer to the assembly of two components in a non-permanent fashion.

In contrast, the term "fixedly attached" shall refer to two components joined in a manner such that the components may not be readily separated (for example, without destroying one or both of the components). Exemplary non-limiting modalities of fixed attachment may include joining with permanent adhesive, rivets, stitches, nails, staples, welding or other thermal bonding, or other joining techniques. In addition, two components may be "fixedly attached" by virtue of being integrally formed, for example, in a molding process.

In other words, the interchangeable components described herein are configured to be repeatedly fasten or be secured to a device via various attachment mechanisms, and are further configured for repeated release or detachment from the device. Furthermore, the components may be installed on one device, and then removed and installed on a second, different device. As an example, a user may swap housing components between two laptops, or share components with friends or other users with devices configured to connect to the interchangeable components. In some implementations, the devices described herein may be understood to comprise a female connector or mechanism that is configured to receive the housing component comprising a corresponding 'male' connector. More specifically, the interchangeable component can be configured to be received by the 'receptacle' of the female-end provided by the receiving portion of the device. In other words, the device (in this case, the receiving portion) and interchangeable component may each be sized and dimensioned to permit the interchangeable component to be snugly inserted and/or securely received by the device.

Figure 2A:
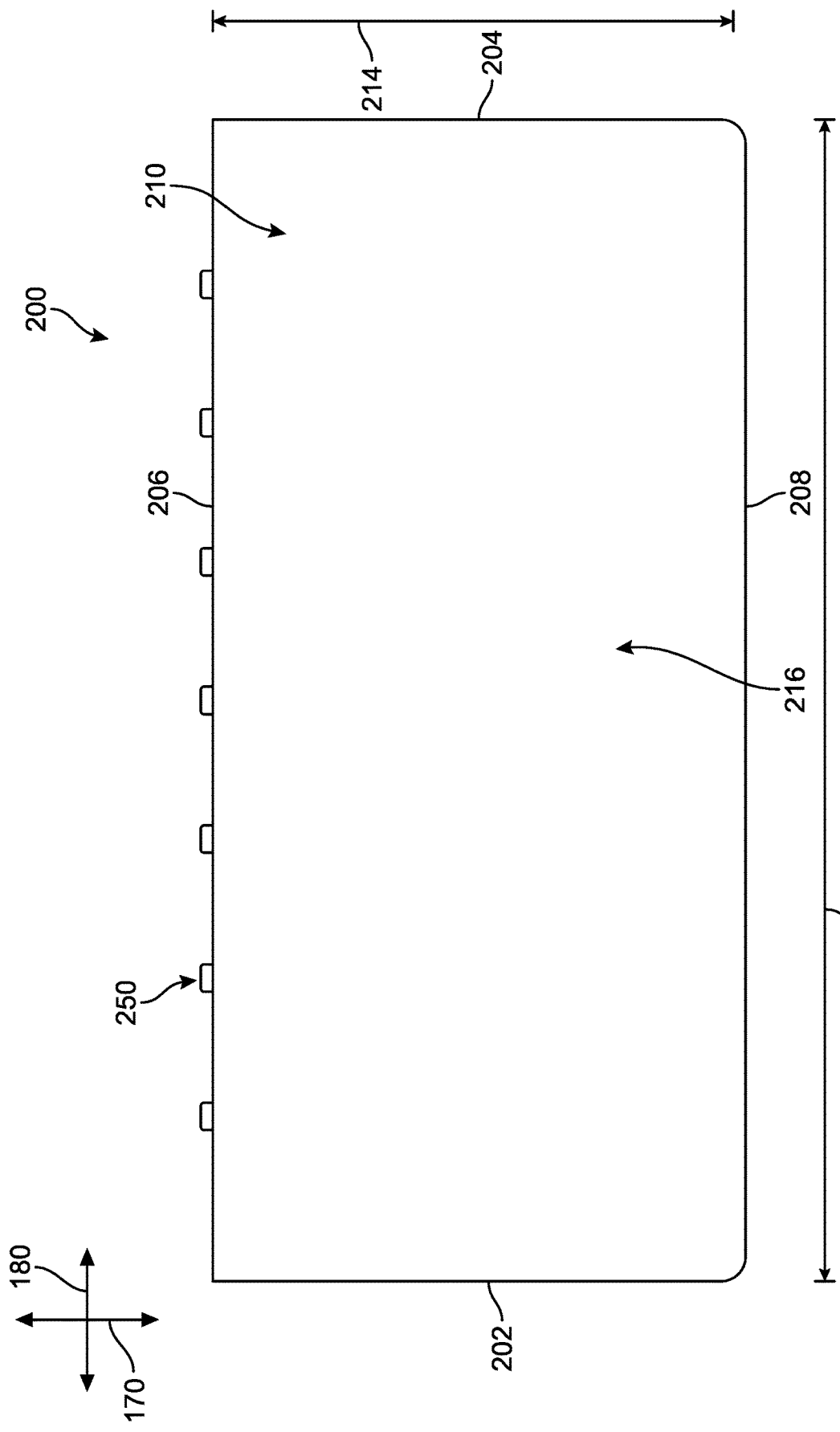
FIG. 2A is a top-down view of an implementation of a first housing panel component.

In order to provide further context for the uses and applications of the systems described herein, FIGS. 2A-5 present a non-limiting example of an interchangeable housing panel component ("housing panel" or "housing component") 200 that can be used in conjunction with a housing of various computing devices. In FIG. 2A, a top-down view of the housing panel component 200 is provided, and in FIG. 2B, a bottom-up view of the housing panel component 200 is provided. In other words the two figures show two views of the same component, one directed to a top side or upper surface 210 (FIG. 2A), and the other is directed to a bottom side or a lower surface 220 (FIG. 2B). In FIG. 2A, the housing panel component 200 includes a substantially continuous peripheral (outermost) edge-band extending around the outer periphery of the panel. The edge-band can be understood to comprise a first side edge ("first edge") 202, a second side edge ("second edge") 204, a rearward edge 206, and a forward edge 208 that collectively provide an outer perimeter or boundary of a body portion 216 of the housing component. In different implementations, the upper surface 210 can include any material or design, and can be selected and/or customized to reflect the preferences of a user. Furthermore, the upper surface 210 provides the external or outermost surface of the component, such that, when installed, the upper surface 210 remains exposed or visible, while the lower surface 220 is configured to face toward the receiving portion of the device and is therefore hidden, covered, or otherwise not intended to be visible to a user once the component is installed. In addition, the housing panel component 200 can be seen to include a length 212 extending from the first edge 202 to the second edge 204 (along longitudinal axis 180), and a width 214 extending from the rearward edge 206 to the forward edge 208 (along lateral axis 170).

In different implementations, the housing panel component 200 can include provisions for removable attachment to a device. As a first example of such a mechanism, a plurality of tab portions 250 can be seen extending upward from the rearward edge 206 of the housing panel component 200. These tab portions 250, as well as other fastening mechanisms, will be described in detail below.

Figure 2B:
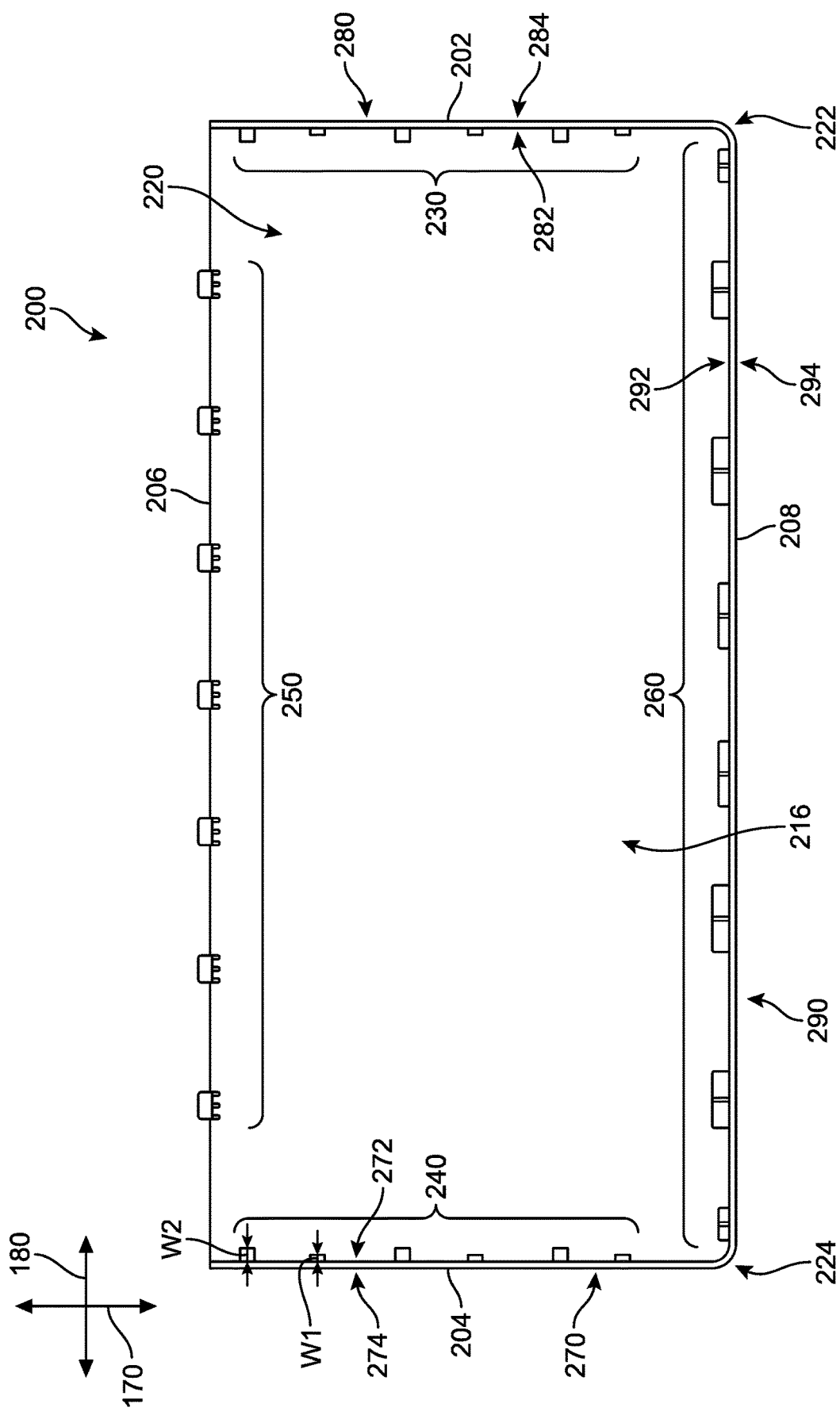
FIG. 2B is a bottom-up view of an implementation of the first housing panel component.

In FIG. 2B, the housing component has been 'flipped' over to illustrate the lower surface 220 (an opposite facing surface relative to the upper surface) and offer the reader an introductory view of the fastening mechanisms that may be included in the housing component. For example, as shown in FIG. 2B, the housing panel component 200 also includes a first sidewall 280 extending distally outward (here, in a direction vertically upward, toward the viewer) from the first edge 202 of the body portion 216, and a second sidewall 270 extending distally outward (here, in a direction vertically upward, toward the viewer) from the second edge 204. In addition, the housing panel component 200 includes a third sidewall 290 that extends distally outward (here, in a direction vertically upward, toward the viewer) from the forward edge 208 of the body portion 216. In the example of FIG. 2B, both the first sidewall 280 and the second sidewall 270 extend along a direction that is aligned with the lateral axis 170. In one implementation, the first sidewall 280 and the second sidewall 270 are substantially parallel. Furthermore, the third sidewall 290 in this example extends along a direction that is aligned with the longitudinal axis 180. In one implementation, the third sidewall 290 can be oriented orthogonally relative to the first sidewall 280 and/or the second sidewall 270.

In some implementations, these three sidewalls (280, 270, 290) can be joined together or otherwise be configured to extend along the peripheral edge as a single piece to form a substantially continuous, U-shaped peripheral sidewall, as shown in FIG. 2B. While in FIG. 2B, the U-shape includes curved connector regions (i.e., a first connector region 222 and a second connector region 224), in other implementations the sidewalls may end more sharply and join or merge together at right-angles instead.

In some implementations, the sidewalls can be associated with one or more connector elements that enable or otherwise facilitate the fastening or securement between the housing panel component 200 and the device and these connector elements, together with corresponding connector elements on the device itself, serve as attachment mechanisms. As a general matter, these connector elements can involve a mating connection process, in which a first connection element of the interchangeable housing panel component is mated, inserted, joined, contacted, secured to, or otherwise becomes removably connected with a second connection element of the computing device. However, it should be understood that the connector element properties described herein can also incorporate additional fastening elements, such as but not limited to magnetic or other self-mating connector materials, clasps, hook and loop fasteners, snap fasteners, screws, buckles, sliders, or other connection components. These connector elements, as will be discussed in greater detail below, provide a balance between ease of installation and mating with a computing device, and reliability and durability of installation. In other words, the various types of connector elements described herein are (a) simple to secure together (installation involves a quick slide-and-click on process), (b) dependable once secured (e.g., remaining firmly attached to the device throughout everyday use and transport of that device, and also providing a resilient component that can be maintained for the life of the device), and (c) straightforward to remove for a user (quick and simple disconnect process). In addition, by arranging connector elements along all four edges of the housing panel component, the stability or anchoring of the housing panel component to the device is ensured. Furthermore, the types of connector elements and their specific structures are designed to make installation straightforward and easy, but inadvertent removal much more unlikely. For example, the mechanisms are oriented in a way that requires a user to exert a specific sequence of applied pressure and force to disengage the various connector elements that have been mated with one another, such that removal or loosening of the housing panel component from the device is highly unlikely to occur accidentally.

Referring to FIG. 2B, the first sidewall 280 includes a first set of raised portions 230 protruding from a first interior surface 282 of the first sidewall 280, where the first interior surface 282 is an opposite facing surface of a first exterior surface 284 of the first sidewall 280. Similarly, the second sidewall 270 includes a second set of raised portions 240 protruding from a second interior surface 272 of the second sidewall 270, where the second interior surface 272 is an opposite facing surface of a second exterior surface 274 of the second sidewall 270. In different implementations, the third sidewall 290 includes a group of projections 260 protruding from a third interior surface 292 of the third sidewall 290, where the third interior surface 292 is an opposite facing surface of a third exterior surface 294 of the third sidewall 290. It can be seen that the raised portions can include different sizes or dimensions in some implementations. For example, some raised portions may extend further proximally inward than neighboring raised portions (as shown in FIG. 2B). Additional details regarding the raised portions will be provided with reference to FIGS. 3A-3C, and additional details regarding the projections 260 will be provided with reference to FIG. 5. While not shown here, the connector elements described herein can be further associated with magnetic elements that can help guide or facilitate the attachment process between the housing panel component and the display housing.

In different implementations, connector elements can also be provided that are not associated with a sidewall. For example, in FIG. 2B, the housing panel component 200 includes plurality of tab portions 250 that extend in an outward direction (distally) away from the body portion 216. These tab portions 250 are anchored or integrally formed along the rearward edge 206. In some implementations, the tab portions can be made of the same material as the body portion, while in other implementations, the material can differ. Additional details regarding the tab portions 250 will be provided with reference to FIG. 4.

Furthermore, in the example of FIG. 2B, the first interior surface 282 and the second interior surface 272 can be observed to face toward one another. In some implementations, these two sets of raised portions (230, 240) are arranged in a substantial mirror-image positioning relative to one another. However, in other implementations, one or both of the sidewalls 270 and 280 may be oriented diagonally relative to the lateral axis 170, or otherwise include curvature or non-linear portions, and the raised portions arranged along each sidewall can be vary in their spatial position. In another example, the two side portions as demarcated by a lateral-midline along the body portion 216 can be symmetrical with respect to one another.

Figure 3A:
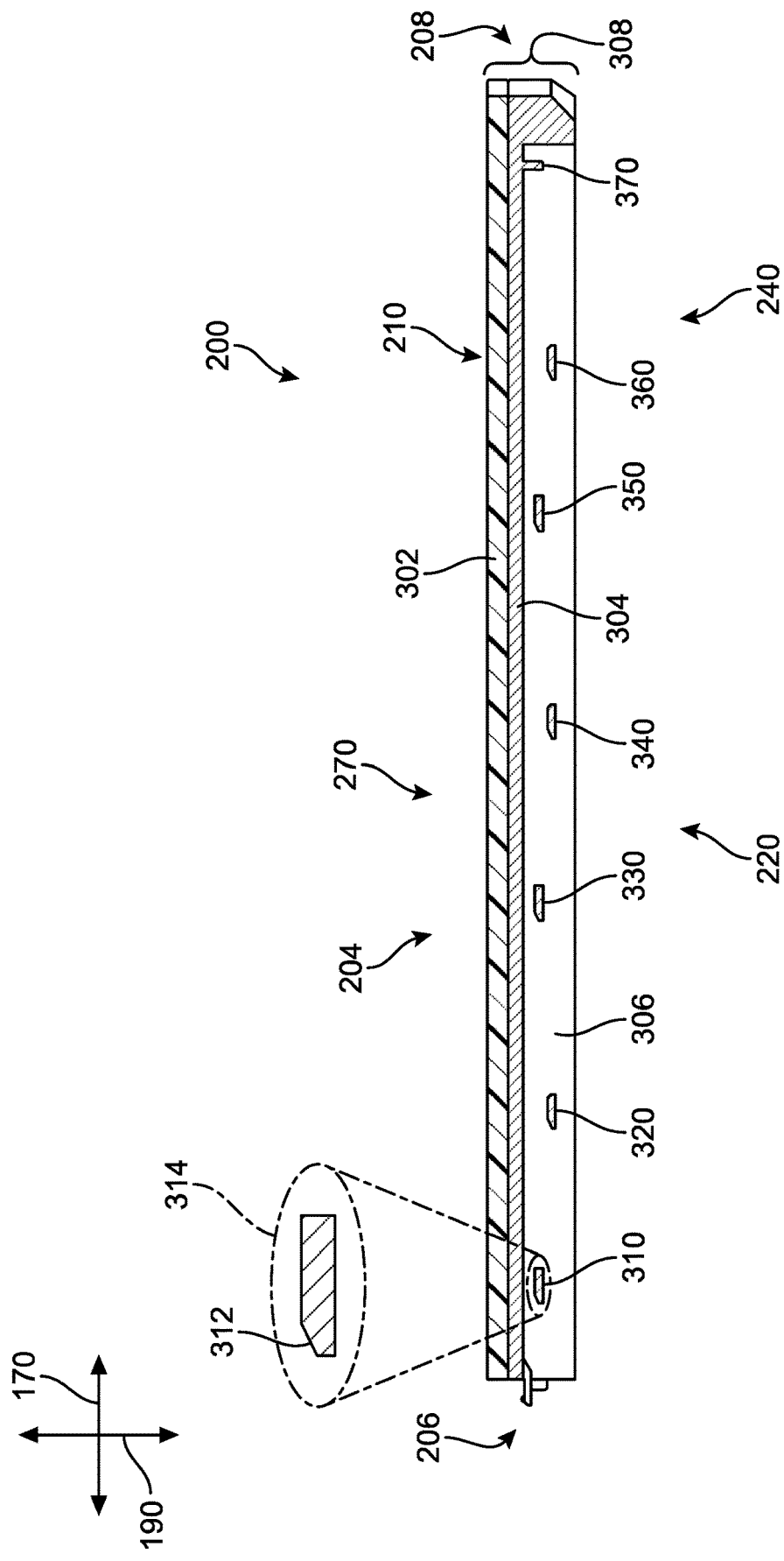

Referring now to FIGS. 3A-3C, further information pertaining to the raised portions introduced above is provided. In FIG. 3A, a side view of the housing panel component 200 is illustrated along the lateral axis 170 of FIG. 2B in which the second interior surface 272 of the second sidewall 270 is visible. In FIG. 3A, the arrangement of the second set of raised portions 240 can be more clearly observed. In this specific example, the second set of raised portions 240 comprises six raised portions, including a first raised portion 310, a second raised portion 320, a third raised portion 330, a fourth raised portion 340, a fifth raised portion 350, and a sixth raised portion 360. In different implementations, there may be fewer or greater number of raised portions. In addition, it may be seen that each raised portion is substantially similar in three-dimensional shape relative to the other raised portions. In this case, each raised portion has a generally trapezoidal or quadrangular shape. However, as shown in FIG. 2B, the extent that each raised portion is 'raised' beyond the sidewall surface or otherwise protrudes can differ. Though not observable in the side views of FIGS. 3A-3C, referring back to FIG. 2B, it may be seen that first raised portion 310, third raised portion 330, and fifth raised portion 350 each have a first width W1 and the second raised portion 320, fourth raised portion 340, and sixth raised portion 360 each have a larger, second width W2. Thus, an internal volume of each of the first raised portion 310, third raised portion 330, and fifth raised portion 350 will be smaller than an internal volume of each of the second raised portion 320, fourth raised portion 340, and sixth raised portion 360. In other words, the extent that each raised portion protrudes outward or away from the sidewall can vary.

As depicted in an enlarged view 314 of the first raised portion 310, the raised portion may include a slanted or sloped edge 312 that is oriented diagonally relative to the remaining three edges. This sloped edge 312 is provided toward the side that will initially engage with the corresponding mechanisms of the receiving portion of a device, and can allow the slide-in and slide-out processes to occur more smoothly and easily for the user. in other words, the direction of the slant, where the sloped edge increases in height from a lower point to a higher point, is configured to enable or facilitate the guidance of the raised portion into the specially shaped recesses that may be formed in the receiving portion of the device (see FIGS. 12A-12C). In some other implementations, the raised portion may include curved or rounded, rather than sharp, edges. In addition, it may be understood that the thickness of each raised portion can vary and can be configured to match or generally 'fit' the depth of its corresponding recess in the receiving portion.

Furthermore, in different implementations, the materials comprising the housing panel component 200 can vary, and may incorporate a single primary material, or multiple materials with varying properties. In FIG. 3A, for purposes of illustration, the housing panel component 200 includes three materials, including a first material 302 corresponding to the upper (outermost, exposed, or external) surface 210 that extends across the body portion 216 and in some cases over the edges and along the surfaces of the sidewalls (see FIGS. 2D, 2E, and 2F), a second material 304 corresponding to an intermediate or substrate layer of the component. In some implementations, another, third material 306 corresponding to the material of the sidewalls can also be used. It is to be understood that the differences in cross-hatching are presented for purposes of example only, and in different implementations, the material comprising the entirety or substantial entirety of the housing panel component 200 can be a single, uniform material (see FIG. 2C), or only two materials (see FIGS. 2D, 2E, and 2F), or three or more materials. In this example, the first material 302 may be a soft fabric or textile, wood (or artificial wood laminate or other laminates), thermoplastic, or leather, the second material 304 may be configured to provide structural support (such as a plastic molding), and an optional third material may be more rigid to withstand the repeated engagements as it functions to support various attachment mechanisms.

In different embodiments, each of the materials can include various properties. In some implementations, the various portions of the housing panel component may be formed from one or more of a plurality of material elements (e.g., textiles, polymer sheets, foam layers, leather, synthetic leather, knitted fabrics, etc.) that are stitched together or otherwise laid or disposed adjacent to one another to form the housing panel component. Other materials that could be used in various implementations include, but are not limited to: expanded rubber, foam rubber, various kinds of foams, polyurethane, nylon, Gore-Tex, leather, plastic, textiles, as well as possibly other materials. Other parts of the housing panel components may be made from any of a plurality of materials or combination of materials, such as leather, leather-like materials, polymer materials, plastic materials, and textile fabrics and materials. Such materials can offer a more pleasing aesthetic appearance and feel to the housing panel component, which can be of great importance to a user.

In addition, each of the layers comprising the housing panel component may be formed from any generally two-dimensional material. As utilized with respect to the present invention, the term "two-dimensional material" or variants thereof is intended to encompass generally flat materials exhibiting a length and a width that are substantially greater than a thickness. Accordingly, suitable materials for at least the body portion of the housing panel component (whether comprising one or multiple layers), and/or the sidewalls, include various textiles, polymer sheets, or combinations of textiles and polymer sheets, for example.

Textiles are generally manufactured from fibers, filaments, or yarns that are, for example, either (a) produced directly from webs of fibers by bonding, fusing, or interlocking to construct non-woven fabrics and felts or (b) formed through a mechanical manipulation of yarn to produce a woven or knitted fabric. The textiles may incorporate fibers that are arranged to impart one-directional stretch or multidirectional stretch, and the textiles may include coatings that form a breathable and water-resistant barrier, for example. The polymer sheets may be extruded, rolled, or otherwise formed from a polymer material to exhibit a generally flat aspect. Two-dimensional materials may also encompass laminated or otherwise layered materials that include two or more layers of textiles, polymer sheets, or combinations of textiles and polymer sheets. In addition to textiles and polymer sheets, other two-dimensional materials may be utilized for housing panel component or portions thereof (e.g., the outermost covering or first layer 302). Although two-dimensional materials may have smooth or generally untextured surfaces, some two-dimensional materials will exhibit textures or other surface characteristics, such as dimpling, protrusions, ribs, or various patterns, for example. Despite the presence of surface characteristics, two-dimensional materials remain generally flat and exhibit a length and a width that are substantially greater than a thickness. In some configurations, mesh materials or perforated materials may be utilized in the housing panel component.

Furthermore, in some implementations, at least the outer surface of the housing panel component (the surface that is visible after installment on a device) can be treated to provide various external appearances to the material. For example, a molding texture, embossing, metal wire drawing, painting, printing, water transfer printing, hot press forming, texturing (e.g. leather grain), hot stamping, laser engraving, metal etching, metal stamping, silk-screen printing, and/or techniques based on IML (In Molding Label), IMF (In Molding Film), IMR (In Molding Roller), OMD (over-molding or high-pressure transfer), OMR (over-molding release or release film) VCM plates and boards (vinyl chloride), and/or CNC machining.

In some implementations, dissimilar materials described herein may be attached by fusing or welding. As utilized herein, the terms "fusing" and "welding" (and variants thereof) are defined as a securing technique between two elements that involves a softening or melting of the material of at least one of the elements such that the materials of the elements are secured to each other when cooled. Similarly, the term "weld" or variants thereof is defined as the bond, link, or structure that joins two elements through a process that involves a softening or melting of material within at least one of the elements such that the elements are secured to each other when cooled. Welding may involve the melting or softening of two components such that the materials from each component intermingle with each other, that is, the materials may diffuse across a boundary layer (or "heat affected zone") between the materials, and are secured together when cooled. Alternatively, welding may involve the melting or softening of a material in a first component such that the material extends into or infiltrates the structure of a second component, for example, infiltrating crevices or cavities in the second component or extending around or bonding with filaments or fibers in the second component to secure the components together when cooled. Thus, welding of two components together may occur when material from one or both of the components melts or softens. Accordingly, a weldable material, such as a polymer material, may be provided in one or both of the components. Additionally, welding does not generally involve the use of stitching or adhesives, but involves directly bonding components to each other with heat. In some situations, however, stitching or adhesives may be utilized to supplement the weld or the joining of the components through welding. Components that have been welded together will be understood to be "fused" together.

In different implementations, modern embroidery techniques may be utilized to autonomously create an embroidery pattern on a sheet of textile materials that is incorporated into the outermost surface of the housing panel component. Textile materials include fabrics such as cotton, wool or silk, as well as leather, foam, polymer sheets, and synthetic equivalents. Other examples of materials that may be utilized include polyester, nylon, polypropylene, polyethylene, acrylics, wool, acetate, polyacrylonitrile, and combinations thereof. Natural fibers may also be used, such as cellulosic fibers (e.g., cotton, bamboo) or protein fibers (e.g., wool, silk, and soybean).

On the textile materials, a number of stitch techniques may be used. For example, depending on the purpose of the embroidery, the chain stitch, the buttonhole or blanket stitch, the running stitch, the satin stitch, or the cross stitch may be used to produce various designs. The stitching techniques may be used in combination to form a variety of set patterns. The stitching patterns may be decorative, for example the pattern may form a flower or series of flowers, logos, alphanumeric symbols, customized designs, or other patterns. Alternatively the stitching may be structural, such as stitching along the edges of a garment to reinforce the seams. In further cases the stitching may be both decorative and functional, such as the use of a floral pattern use to reinforce a patch.

Typically a thread or yarn is used as the stitching material and stitched into the textile. Commonly the thread or yarn may be made of cotton or rayon, as well as traditional materials like wool, linen or silk. However, embroidery may also sew in dissimilar materials to the textile, usually for decorative purposes. For example, thread created out of precious metals such as gold or silver may be embroidered within more traditional fabrics such as silk. Additionally, additional elements may be sewn in during embroidery, such as beads, quills, sequins, pearls or entire strips of metal. These elements may be sewn in along with yarn or thread using variety of stitching techniques depending on the desired placements of the elements.

In other examples, the materials can be arranged differently. For example, the outermost covering can include a material that only serves as the upper surface 210, while the exterior surfaces of the sidewalls are formed of a different material. In other implementations, the outermost covering can include a material that covers the upper surface 210 and also curves or wraps around (or 'hugs') some or all of the exterior surfaces of the first and second sidewalls, providing a more continuous interface. For example, a ledge portion 308 extending toward the forward edge 208 configured to form a forward facing exterior surface (e.g., a surface facing toward the user 110 of FIG. 1) can include the same material extending along the upper surface 210, or—as shown in FIG. 3A—can be of a different material entirely. In some other implementations, the two materials may similar, but be of different colors or patterns, providing users with greater design choices. In addition, in some implementations, the raised portions can include a fourth type of material, or may extend outward from the sidewall with the same material as the sidewall. In another example the raised portions may be formed of the material providing the substrate and the sidewalls may include a plurality of apertures shaped and sized to allow the raised portions to pass through the apertures as they extend outward from the substrate.

It can further be understood that when multiple layers of materials are incorporated into an interchangeable housing component, the materials can vary in their relative thicknesses. It should also be understood that the interchangeable cover dimensions can be adjusted to accommodate different sized laptops or other computing devices for which the housing panel component is desired. Any other sized-computing device can also benefit from these interchangeable components; as the device size increases, the housing panel component dimensions can also change.

Figure 2C:
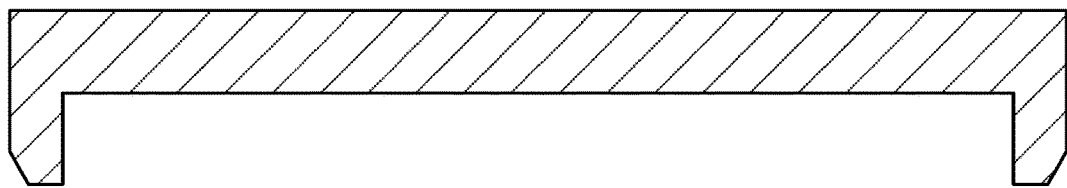
FIGS. 2C-2F are simplified cross-sectional views of a housing panel component in which structural cover variations are implemented to change the appearance of the housing panel component.
Figure 2D:
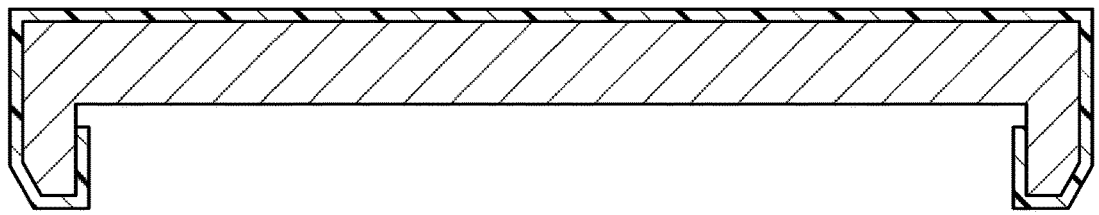
Figure 2E:
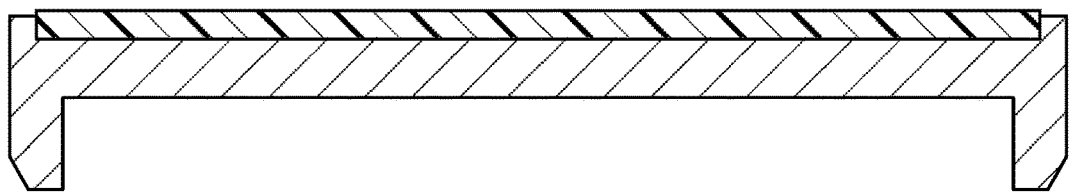
Figure 2F:
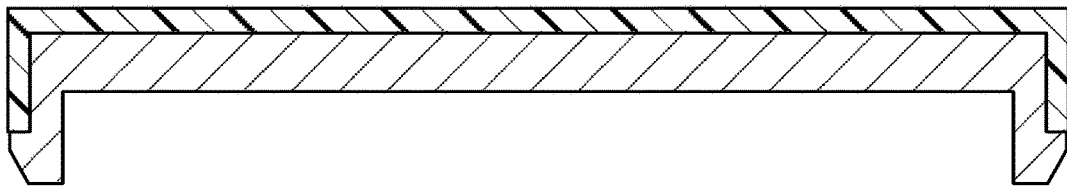

With respect to interchangeable housing panel components that are integrally formed (i.e., as one piece or primarily being made of a single material), for example by plastic molding, the thickness of the plastic can vary relative to the computing device dimensions (see FIG. 2C). As a specific example, a Z-height (vertical axis) of a first computing device may be around 17.9 mm, and a corresponding interchangeable housing panel component may have a thickness of approximately 1.6 mm. In another example, a Z-height (vertical axis) of a second computing device may be around 18.9 mm, and a corresponding interchangeable housing panel component may have a thickness of approximately 1.7 mm.

With respect to interchangeable housing panel components that include an outer cover material and an internal substrate or support structure, the dimensions can vary to accommodate the differences in materials. For example, a first housing panel component can include an upper surface wrap cover that includes two primary materials, where a soft, flexible material, such as a fabric, is wrapped around a more rigid supporting base (see FIG. 2D). In another example, a second housing panel component can include a primary surface recessed design, where there is a slight recessed region along the upper surface of rigid supporting base that is configured to receive versatile decorated materials of a thickness matching the depth of the recess (see FIG. 2E). As a further example, a third housing panel component can be configured to receive a 'wrap around cover' that extends around the sidewalls as well as the upper surface (see FIG. 2F), suitable for soft, flexible material(s) being wrapped around a more rigid supporting base. These softer covers can have a smaller thickness relative to the more rigid substrate. For example, the softer outer material can have a thickness of approximately 0.1 mm to 0.5 mm, and a substrate thickness ranging between 1 mm and 1.5 mm. Where the first computing device had a Z-height of around 17.9 mm, the corresponding interchangeable housing panel component comprising two materials may have a first material thickness of approximately 1.1 mm and a second material thickness of approximately 0.3 or 0.4 mm. In another example, where the Z-height (vertical axis) of the second computing device is around 18.9 mm, the corresponding interchangeable housing panel component comprising two materials may have a first material thickness of approximately 1.2 mm and a second material thickness of around 0.2 or 0.3 mm. Such dimensions can provide a balance between the durability and sturdiness of the housing panel component, as it undergoes repeated removals and installations, as well as an outer appearance and texture that is pleasing to the user.

While the bottom-up view of FIG. 2B appeared to show the raised portions on each of the first sidewall 280 and the second sidewall 270 as being arranged in a single line, FIGS. 3A-3C more clearly shows that in some implementations, the arrangement can vary widely. Specifically, in FIGS. 3B and 3C, the second sidewall 270 is shown in two parts to better illustrate one possible arrangement of the raised portions. In FIG. 3B a forward portion of the housing component is shown and in FIG. 3C a rearward portion of the housing component is shown. The second sidewall 270 includes the six raised portions of the second set of raised portions 240. It can be seen that in different implementations, two or more of the raised portions can be disposed at varying heights along the sidewall relative to vertical axis 190.

For purposes of reference, in FIG. 3B, the first raised portion 310 is disposed at a first height H1 along the second sidewall 270, the second raised portion 320 is disposed at a second height H2, the third raised portion 330 is disposed at a third height H3. Similarly, in FIG. 3C the fourth raised portion 340 is disposed at a fourth height H4 along the second sidewall 270, the fifth raised portion 350 is disposed at a fifth height H5, and the sixth raised portion 360 is disposed at a sixth height H6. While in some implementations the heights H1-H6 can be the same, in other implementations, two or more may differ. In FIG. 3B, while the first height H1 and the third height H3 are substantially similar or equal, the second height H2 is smaller than either H1 or H3. In addition, in FIG. 3C, while the fourth height H4 and the sixth height H6 are substantially similar or equal, the fifth height H5 is greater than either H4 or H6. In addition, in this example, heights H1, H3, and H5 are approximately equal, and heights H2, H4, and H6 are approximately equal. This produces a staggered height pattern, and in this specific case, a repeated "high-low" alternating pattern for the raised portions. This pattern will be again reflected in the discussion of the receiving portion for the device (see FIGS. 7B and 8B). In other words, the raised portions can be arranged to correspond to any spatial pattern that will align with, for example, the arrangement of corresponding receiving notches or recesses in the device to ensure a secure connection between the two sections (see FIGS. 12A-12C).

Furthermore, in some implementations, the second sidewall 270 may also include additional fastening mechanisms. In FIGS. 3A and 3B an elongated flange portion 370 is depicted near the forward edge 208, spaced apart slightly from the ledge portion 308. As will be illustrated further below, the flange portion 370 can be sized and dimensioned to slide into a corresponding slot of the device (see FIGS. 12A-12C) and help complete or finalize the connection process.

Figure 4:
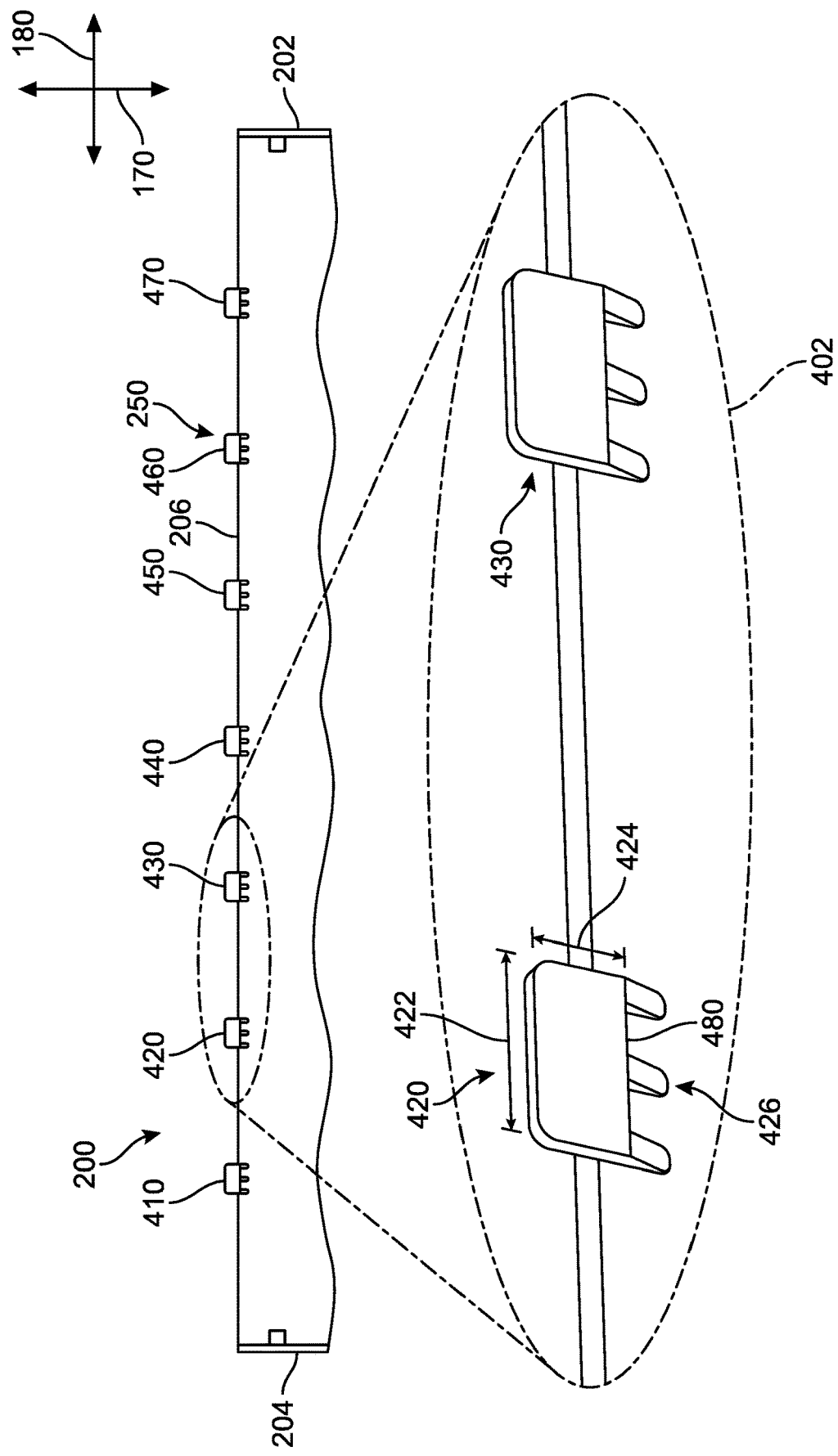
FIG. 4 is an isolated view of an implementation of a plurality of tab portions for the first housing panel component.

As introduced above, the housing panel component 200 also includes the plurality of tab portions 250 arranged along the forward edge 206. As the housing panel component 200 is inserted onto or into the receiving portion of a device, when it nears the base portion, the tab portions 250 can be aligned with corresponding recessed slots formed in portions of both of the rearmost surface of the receiving portion as well as the base portion (see FIG. 10). In one implementation, the tab portions can be configured to provide a snap-fit connection with the recessed slots. Referring to the isolated view of FIG. 4, in this case the tab portions 250 include a first tab 410, a second tab 420, a third tab 430, a fourth tab 440, a fifth tab 450, a sixth tab 460, and a seventh tab 470. In different implementations, there may be fewer or greater number of tab portions. In addition, it may be seen that each tab portion is substantially similar in three-dimensional size and dimensions relative to the other tab portions. In this case, each tab portion has a generally rounded rectangular (tab) shape. In FIG. 4, the second tab 420 and the third tab 430 are illustrated in an enlarged view 402 for the reader's benefit. The second tab 420 has a length 422 extending along the longitudinal axis 180 that is greater than its width 424 extending along the lateral axis 170. In different implementations, the length 422 will be similar to a length of a recessed slot in the device configured to receive the tab portion, and the width 424 will be similar to a width of the recessed slot. In some other implementations, though, the width 424 may be smaller than the width of the recessed slot, whereby the recessed slot is slightly larger to allow for the smooth passage of the tab into the rearmost portion of the recessed slot. Furthermore, an overall thickness of the tab portion can be similar to the depth of the recessed slot such that there is a flush and secure fit when the two pieces are joined.

Each of the tab portions are joined to the rearward edge 206 by a series of rib elements. For example, in the enlarged view 402, three rib elements 426 extend distally outward from the lower surface 220 of the body portion 216. A back edge 480 of the second tab 420 is then integrally attached with a distal end of each of the three rib elements 426. This type of elastic strut-like mechanical structure is important in that it allows the tab portion to move up and down within a limited range of flexibility to facilitate the insertion of the tabs into their corresponding recessed slots that are disposed or formed below the larger outer surface of the receiving portion of the device. For example, if the ribs instead comprised a larger, one-piece or otherwise bulkier 'bridge', there might be a greater likelihood of damage or break between a tab and the body portion 216. This rib arrangement permits gentle 'bounce' or yielding as the user slides the housing panel component into place. Once the tabs are received by the recessed slots, there may be a click, or locking step.

In addition, in this case, it can be understood that each of the plurality of tabs 250 lie along a different horizontal plane (lower with respect to the vertical axis) than the horizontal plane of the body portion 216. Such an arrangement also allows the final connection between the housing panel component and the device to appear more seamless, as the tabs are received by slots that are at least partially beneath or within the base portion and therefore hidden from view once the housing panel component is fully connected.

Also introduced above, the housing panel component 200 includes the group of protruding portions 260 arranged along the forward edge 208. As the housing panel component 200 is inserted onto or into the receiving portion of a device, when it nears the final stage of installation, the protruding portions 260 can be aligned with corresponding apertures that are formed in the forward-facing side of the receiving portion (see FIG. 11).

Figure 5:
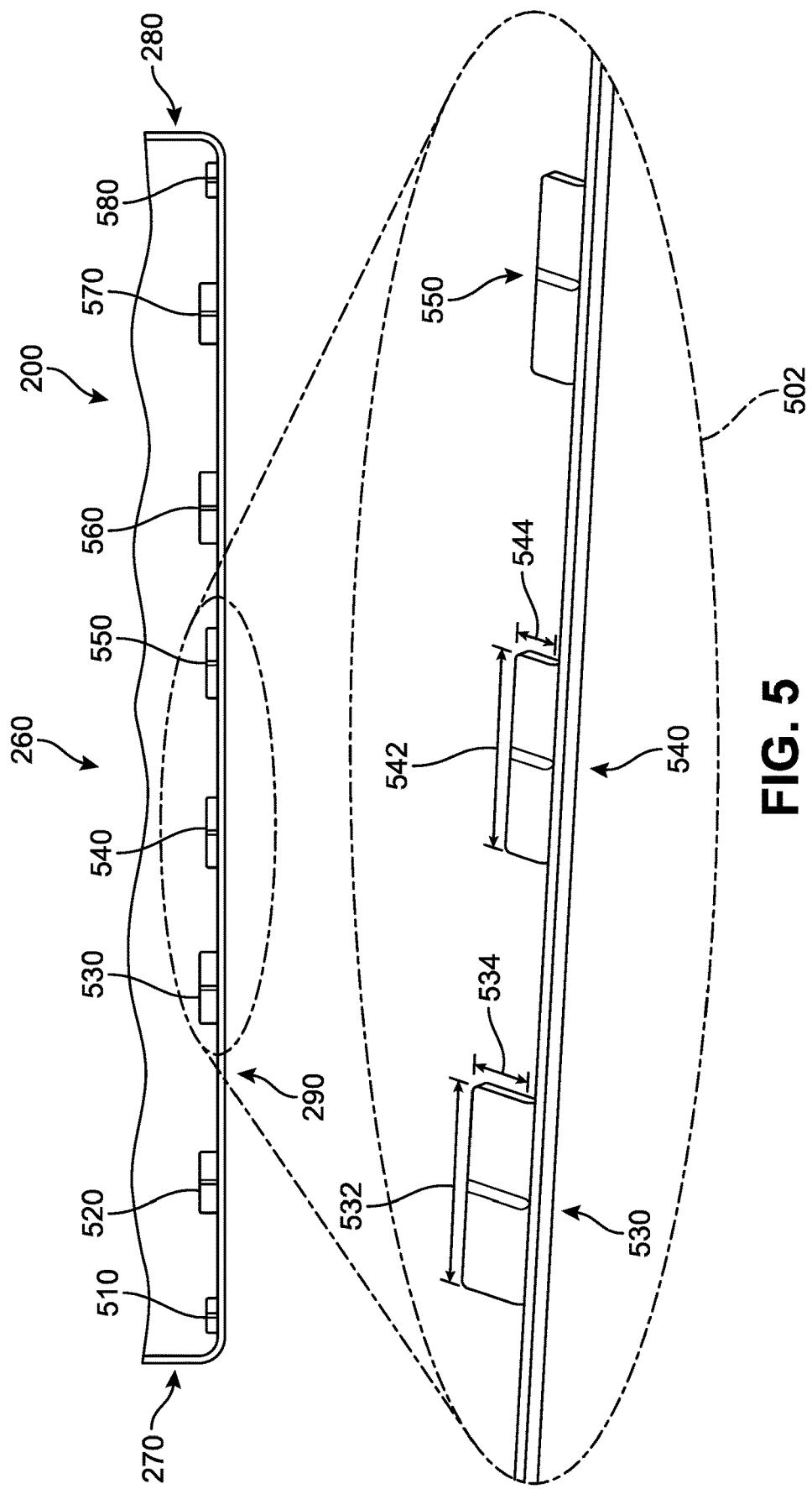
FIG. 5 is an isolated view of an implementation of a group of protruding portions for the first housing panel component.

With reference to the isolated view of FIG. 5, in this example the protruding portions 260 include a first protruding portion 510, a second protruding portion 520, a third protruding portion 530, a fourth protruding portion 540, a fifth protruding portion 550, a sixth protruding portion 560, a seventh protruding portion 570, and an eighth protruding portion 580. In different implementations, there may be fewer or greater number of protruding portions. In addition, it may be seen that while some protruding portions are substantially similar in three-dimensional size and dimensions relative to other protruding portions, other protruding portions differ. In this case, each protruding portion has a generally rounded prism shape. In addition, second protruding portion 520, third protruding portion 530, sixth protruding portion 560, and seventh protruding portion 570 are substantially equal in size and shape, while being larger in thickness, length, and width from the other four protruding portions. Similarly, fourth protruding portion 540 and fifth protruding portion 550 are substantially equal in size and shape, while being smaller in thickness and width from the four protruding portions 520, 530, 560, and 570. Finally, first protruding portion 510 and eighth protruding portion 580 are substantially equal in size and shape, while being smaller in thickness, length, and width from the two protruding portions 540 and 550. In some implementations, the arrangement of the protruding portions as demarcated by a lateral-midline along the body portion 216 can be symmetrical with respect to one another, as shown in FIG. 5, providing a more even weight distribution that can improve user experience during installation and removal operations.

In FIG. 5, the third protruding portion 530, fourth protruding portion 540, and fifth protruding portion 550 are shown in an enlarged view 502 for the reader's benefit. The third protruding portion 530 has a first length 532 extending along the longitudinal axis 180 that is greater than its first width 534 extending along the lateral axis 170. Similarly, the fourth protruding portion 540 has a second length 542 that is greater than its second width 536. Relative to one another, the first length 532 is similar to the second length 534; however, the first width 534 is larger than the second width 544. In different implementations, as will be discussed below with reference to FIG. 11, the apertures formed in the device configured to receive each of these protruding portions can be sized and dimensioned to snugly match the particular three-dimensional shape and size of each corresponding protruding portion and permit a secure lock between the two components.

Referring now to FIGS. 6-11, the sequence of drawings present a non-limiting example of a housing for a device that can be used in conjunction with the interchangeable housing panel components described herein. In FIG. 6, a top-down view of a portable computing device ("device") 600 is shown (without the housing panel), including a display housing (e.g., the housing portion for the lid of the device that holds the display screen) that comprises both a base portion 610 and a receiving portion 620. In different implementations, the proportion of surface area associated with each portion can differ. For example, in FIG. 6, the base portion 610 has a first surface area that extends across a first lateral distance 682, and the receiving portion 620 has a second, larger surface area that extends across a second lateral distance 684. In some implementations, the first surface area of the base portion 610 can be equal to or less than the second surface area of the receiving portion. This arrangement can ensure that a significant extent of the lid is customizable with an interchangeable housing panel component. In FIG. 6, the second surface area of the receiving portion 620 is approximately twice as large as the first surface area of the base portion 610. In other words, the first surface area comprises approximately ⅓ of the total surface area of the exterior surface of the display rear (backside of the display) housing or lid portion 690, and the second surface area comprises approximately ⅔ of the total surface area for the lid portion 690.

For purposes of reference, the device 600 has a first side 602, a second side 604, a rearward side 606, and a forward side 608. The base portion 610 is disposed nearer the rearward side 606 of the device 600 and the receiving portion 620 is disposed nearer the forward side 608 of the device 600. In addition, the base portion 610 includes a generally rectangular prism shape, and comprises a plurality of external surfaces. In this example, the base portion 610 has a top surface 652 that extends between a first side surface 612 (disposed along the first side 602 of the device 600) and a second side surface 614 (disposed along the second side 604 of the device 600) relative to the longitudinal axis 180. In addition, the top surface 652 of the base portion 610 extends between a third side surface 616 (disposed along the rearward side 606), and a fourth side surface 618 (disposed directly adjacent to the receiving portion 620) relative to the lateral axis 170. Each of the side surfaces extend along a generally vertical plane, in contrast to the top surface 652 which extends along a generally horizontal plane. The fourth side surface 618 can be configured to receive or be pressed against a rearward edge 206 (see FIG. 2A) of the housing panel component when the housing panel component is installed.

In other words, the base portion 610 is thicker than the receiving portion 620 (i.e., relative to the vertical axis), and the receiving portion 620 is recessed or 'thinner' relative to the base portion 610. In some implementations, the difference in thickness between the receiving portion 620 and the base portion 610 can correspond to a thickness of the housing panel component that is to be accommodated by the device, resulting in a smooth, flush interface between the outer surface of the rearward edge of the housing panel component and the fourth side surface 618. Thus, when there is no housing panel component installed, the fourth side surface 618 is exposed and visible, and when a housing panel component is installed, the fourth side surface 618 is no longer visible. This can be seen more clearly in the views provided by FIGS. 7B and 8B, where a thickness T1 and a thickness T2 are labeled for purposes of clarity to highlight the difference in thickness between the base portion 610 and the adjacent receiving portion 620.

Similarly, in some implementations, the length of the base portion 610 (relative to the longitudinal axis 180) can be greater than a length of the receiving portion 620. This can be observed in FIG. 7A along the first side 602, where a first side portion 652 of the base portion 610 extends a first length L1 distally outward, and in FIG. 8A along the second side 604, where a second side portion 654 of the base portion 610 extends a second length L2 distally outward, relative to the receiving portion 620. In other words, each of the two side portions of the base portion 610 jut outward relative to the receiving portion 620, each with surface areas sufficient to provide an interface for the rearmost ends of the first and second sidewalls of the housing panel component when the housing panel component is installed.

An introductory view of the fastening mechanisms that may be incorporated in device 600 for attachment to a housing panel component is also provided in FIG. 6. In this example, the receiving portion 620 has an interface surface 660 configured to receive or contact the lower surface 220 of the housing panel component. The interface surface 660 extends between a first periphery 672 (disposed along the first side 602 of the device 600) and a second periphery 674 (disposed along the second side 604 of the device 600) relative to the longitudinal axis 180. In addition, the interface surface 660 of the receiving portion 620 extends between a third periphery 676 (disposed adjacent to the fourth side surface 618 of the base portion 610), and a fourth periphery 678 (disposed along the forward side 608) relative to the lateral axis 170.

As noted earlier, the receiving portion 620 can include provisions for removable attachment with an interchangeable housing panel component. In general, these provisions can be arranged to correspond directly with specific connector elements formed on the housing panel component. Some examples of these provisions include a plurality of recessed slots ("slots") 650 arranged along the border associated with third periphery 676. In some implementations, the slots 650 can extend beyond the region corresponding to the receiving portion 620 and be formed within parts of the base portion itself (see FIG. 10 below). In addition, along the first periphery 672 of the receiving portion 620, a first set of grooves 630 is formed, and along the second periphery 674 a second set of grooves 640 is formed. As a general matter, these grooves can be positioned to receive the raised portions described earlier with respect to FIGS. 3A-3C. Furthermore, though not visible in FIG. 6, a group of apertures can also be formed along the fourth periphery 678 of the receiving portion 620 that are configured to snugly receive the group of protruding portions of the housing panel component (see FIG. 5).

Referring now to FIGS. 7A-9, further information pertaining to the sets of grooves introduced above is provided. In FIG. 7A, an isolated top-down view of the first periphery 672 of the receiving portion 620 is shown, and in FIG. 7B, a side view of the first periphery 672 is shown. The first set of grooves 630 comprises six grooves, including a first groove 710, a second groove 720, a third groove 730, a fourth groove 740, a fifth groove 750, and a sixth groove 760. While in some implementations the grooves can be substantially similar in size and shape, in this case, it can be seen that the relative positions and sizes of the grooves vary in an alternating pattern, similar to that described earlier with respect to the raised portions of FIGS. 3B and 3C. As a first example, the first groove 710 has a first depth D1, and the second groove 720 has a second depth D2. In this case, the second depth D2 is deeper or extends further than the first depth D1. This arrangement is repeated, where it may be understood that third groove 730 and fifth groove 750 also each have a depth corresponding to the first depth D1, and the fourth groove 740 and sixth groove 760 each have a depth corresponding to the second depth D2. This variation in depths permits the raised portions—positioned at varying heights along the sidewalls of the housing panel component, to be received by the groove during the initial stage of the installation process and appropriately guided into their respective secured positions, as will be discussed below with reference to FIGS. 12A-12C.

In some implementations, the receiving portion 620 may also include provisions for 'locking' or finalizing the connection between the housing panel component and the device. As described earlier in FIGS. 3A-3C, in some implementations, the housing panel component can include a flange portion disposed toward the forward edge near the first sidewall and/or a flange portion disposed toward the forward edge near the second sidewall. In one implementation, the receiving portion can include a channel 770 along the first periphery 672 (toward the forward side 608) configured to receive a first flange portion and, as shown in FIG. 8B, a second channel 870 along the second periphery 674 configured to receive a second flange portion. In different implementations, such flange portions can be sized and dimensioned to bend elastically before being received by the channels.

For purposes of comparison, in FIG. 8A, an isolated top-down view of the second periphery 674 of the receiving portion 620 is shown, and in FIG. 8B, a side view of the second periphery 674 is shown. The second set of grooves 640 comprises six grooves, including a seventh groove 810, an eighth groove 820, a ninth groove 830, a tenth groove 840, an eleventh groove 850, and a twelfth groove 860. In some implementations, the two sides depicted in FIGS. 7A-8B can be understood to represent structural mirror-images of one another. However, in other implementations, each side can include variations in structure, and be modified as needed to correspond to changes in the size, shape, or positions of the raised portions along the sidewalls of the housing component.

Figure 9:
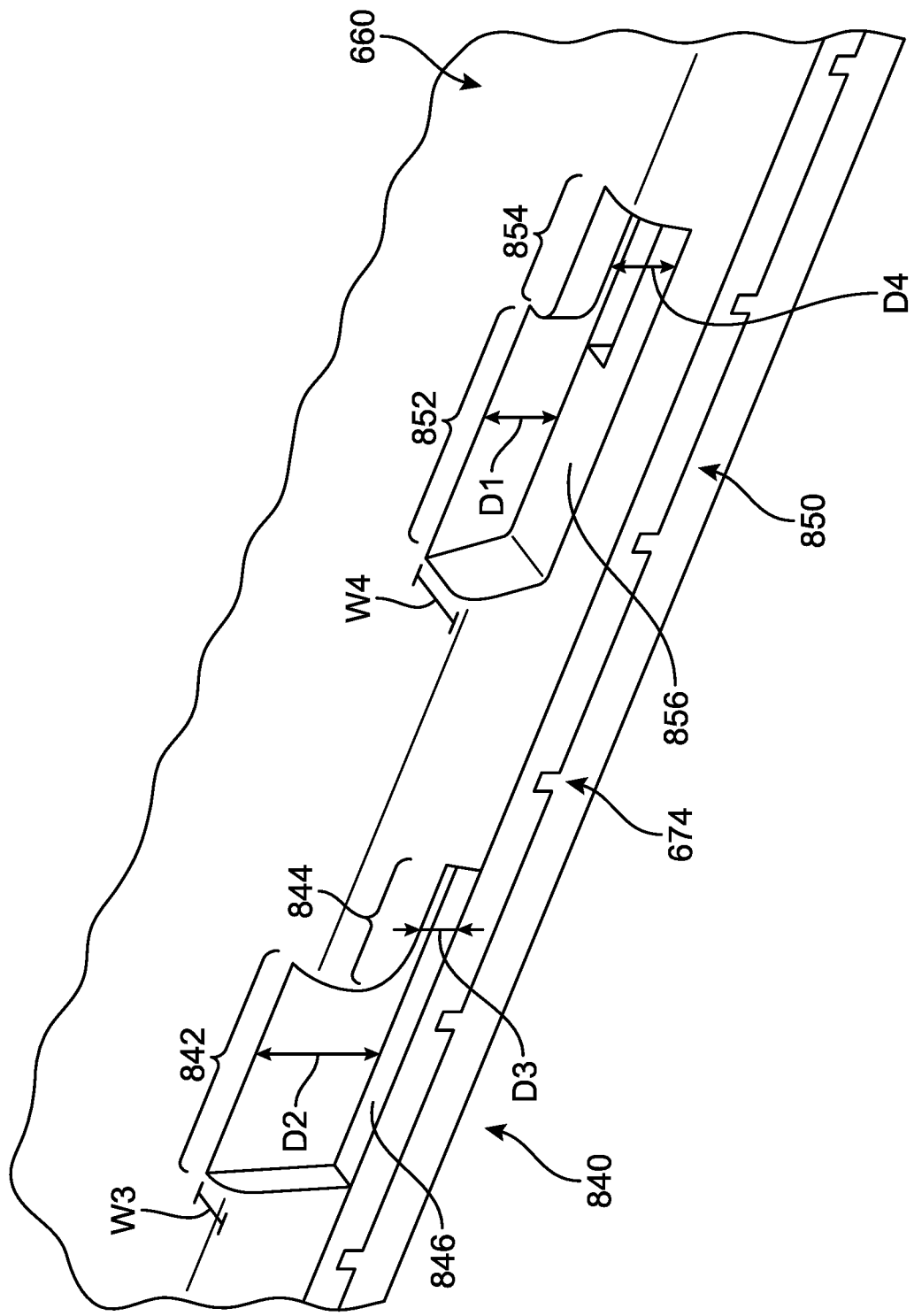
FIG. 9 is an isometric enlarged view of an implementation of two grooves formed along a periphery of the receiving portion.

In order to provide the reader with a greater appreciation of the function of each groove, an isolated isometric view of two of the grooves is illustrated in FIG. 9. In this example, the tenth groove 840 and neighboring eleventh groove 850 are shown. The isometric view reveals more clearly the L-shape of each groove. In other words, each groove includes a main chamber or first segment that is in direct fluid communication with the opening formed on the upward-facing interface surface 660 and extends downward through the side of the receiving portion, as well as a more elongated arm chamber that extends in a rearward direction from and in fluid communication with the main chamber. In FIG. 9, the tenth groove 840 has a first receiving segment 842 (main chamber) and a first securing segment 844 (arm chamber), and the eleventh groove 850 has a second receiving segment 852 (main chamber) and a second securing segment 854 (arm chamber). Each of the main chambers can differ in shape, but can be generally configured to serve as the initial receiving region of the raised portion during installation, as well as the removal route for the same raised portion during removal. Similarly, each of the arm chambers can differ in shape, but can be generally configured to serve as the final locking region once the housing panel component is installed, and will hold or be a receptacle for the raised portion during the duration of the housing panel component's installation on the device.

In FIG. 9, the first receiving segment 842 has a depth corresponding to second depth D2 and the second receiving segment 852 has a depth corresponding to first depth D1, which is smaller than second depth D2. In addition, the first securing segment 844 has a depth corresponding to a third depth D3, and the second securing segment 854 has a depth corresponding to a fourth depth D4. In different implementations, the depth D3 can be approximately equal to a total height of the raised portion that is to be inserted into the first securing segment 844. Similarly, the depth D4 can be approximately equal to a total height of the raised portion that is to be inserted into the second securing segment 854. In some implementations, depths D3 and D4 can be similar. The first depth D1 extends from the interface surface 660 to a first bottom surface 856, and the second depth D2 extends from the interface surface 660 to a second bottom surface 846. Similarly, the third depth D3 extends from a topmost surface of the first securing segment 844 to the second bottom surface 856, and the fourth depth D4 extends from a topmost surface of the second securing segment 854 to the first bottom surface 846. Finally, the 840 is associated with a third width W3 and the 850 is associated with a fourth width W4. In this case, third width W3 is smaller than fourth width W4. These widths can correspond to the relative widths of the raised portions, as described above with respect to FIGS. 2B-3C. In other words, the raised portions that protrude outward less (e.g., first raised portion 310, third raised portion 330, and fifth raised portion 350 with a first width W1) will be received by a correspondingly narrower groove (e.g., with width W3), and the raised portions that protrude outward further (e.g., second raised portion 320, fourth raised portion 340, and sixth raised portion 360 with larger, second width W2) will each be received by a correspondingly wider groove (e.g., with width W4) to ensure a snug fit for each sized-connector element.

Figure 10:
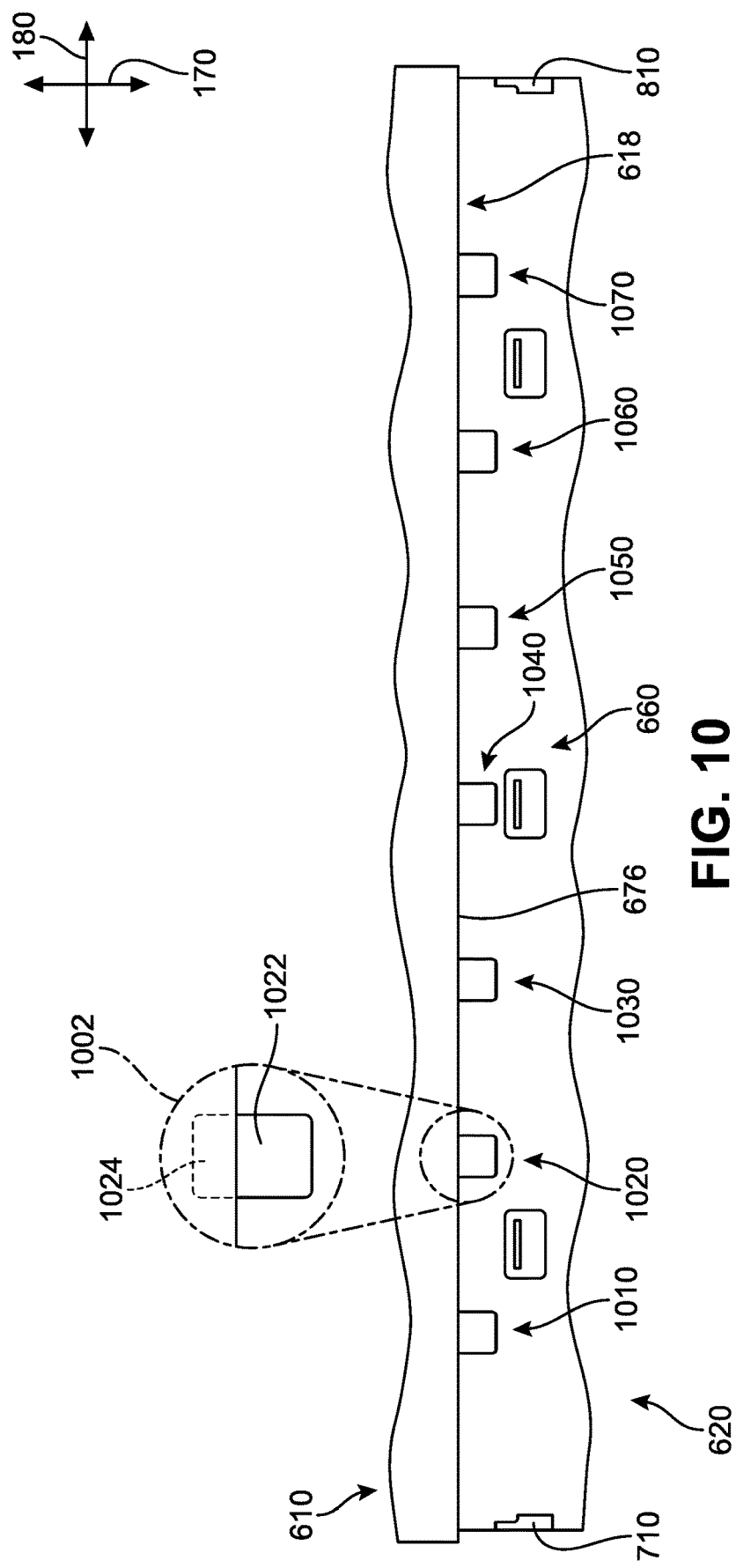
FIG. 10 is an isolated view of a third periphery of the receiving portion including a plurality of recessed slots.

Referring now to FIG. 10, further information about the plurality of recessed slots 650 arranged along the border associated with third periphery 676 is provided. In this example, the slots 650 include a first slot 1010, a second slot 1020, a third slot 1030, a fourth slot 1040, a fifth slot 1050, a sixth slot 1060, and a seventh slot 1070. In different implementations, there may be fewer or greater number of recessed slots. In addition, in FIG. 10, each slot is substantially similar in three-dimensional shape and size relative to the other slots. In this example, each slot has a generally rectangular cross-sectional shape, and has a similar depth as its neighboring slots. However, in other implementations, the extent that each slot is recessed relative to the interface surface 660 can vary in order to accommodate any corresponding variations in the thickness of a tab portion that will be received by the slot (see FIG. 4).

As noted above, in some implementations, the slots 650 can extend beyond the receiving portion 620 and be formed within parts of the base portion 610 itself. An enlarged transparent view 1002 of second slot 1020 is provided as a simplified example. In view 1002, the second slot 620 has a first portion 622 associated with or formed in the receiving portion 620, and a second portion 624 that is in fluid communication with the first portion 622 but is associated with or formed in the base portion 610 (now transparent). In other words, the recessed slot can extend further inward, into the base portion 610. Thus, when a tab portion is inserted into the recessed slot during an installation, the tab portion will initially slide or move through the first portion 622 and then be at least partially received by the second portion 624.

FIG. 11 offers additional detail regarding a group of apertures 1100 formed in the fourth periphery 678 of the receiving portion 620 in a top-down view 1102 and a side view 1104. These apertures 1100 can be sized and dimensioned to receive or mate with the group of protruding portions extending from the forward edge of the housing panel component (see FIG. 5). Thus, for each protruding portion, there is a corresponding aperture. In this example, as there were eight protruding portions described earlier, there are now eight apertures, including a first aperture 1110, a second aperture 1120, a third aperture 1130, a fourth aperture 1140, a fifth aperture 1150, a sixth aperture 1160, a seventh aperture 1170, and an eighth aperture 1180. The number and placement of each aperture can vary in different implementations to correspond to the arrangement of protruding portions for the housing component. It may further be understood that while some apertures are substantially similar in three-dimensional size and dimensions relative to other apertures, other apertures differ. In this case, each aperture has a generally rectangular cross-sectional shape. In addition, second aperture 1120, third aperture 1130, sixth aperture 1160, and seventh aperture 1170 are substantially equal in size and shape, while being larger in depth (volume) from the other four protruding portions. Similarly, fourth aperture 1140 and fifth aperture 1150 are substantially equal in size and shape, while being smaller in depth (volume) from the four apertures 1120, 1130, 1160, and 1170. Finally, first aperture 1110 and eighth aperture 1180 are substantially equal in size and shape, while being smaller in volume from the two apertures 1140 and 1150.

For purposes of clarity, the installation process is depicted in greater detail with reference to FIGS. 12A-14B. In FIGS. 12A-12C, an overview of the process in three general stages is shown with a series of side views. A first stage in FIG. 12A represents an initial stage during which the two components (e.g., housing panel component 200 and a display housing or lid portion 1200 of device 600) are moved toward one another. In this example, the housing panel component 200 approaches the lid portion 1200 and is also moved in a downward direction toward the interface surface 660 of the receiving portion 620. The two components can also be oriented together along the horizontal axis, such that the edges are generally aligned. The second stage of FIG. 12B represents an intermediate or transition stage during which the connection elements are initially inserted or where the male connection element begins a final approach toward its corresponding female receptacle. This stage usually is associated with a termination of the movement of the components toward one another along the vertical axis. The third stage of FIG. 12C represents the secure or installed stage in which the housing panel component 200 is moved into a final position by a last push inward or a movement of the components toward one another along the lateral axis. During the third stage the housing panel component 200 is securely attached to the lid portion 1200 of the device 600. In order to release the housing panel component, the sequence can be reversed, whereby the housing panel component 200 is pulled outward or away from its secure connection with the lid portion 1200 (FIG. 12C), shown loosened in the second stage (FIG. 12B), and removed with an upward and away motion back to the uninstalled or initial stage (FIG. 12A). However, the removal will also require the application of a gentle pressure inward, applied against the first side and the second side (e.g. along a horizontal direction, proximally inward) to loosen the attachment mechanisms prior to and/or during the removal process. Thus, in different implementations, while the installation can involve a more straightforward 'sliding on until secure' process, the removal (sliding off) cannot be initiated until a gentle pressure is also applied along both of the first sidewall and the second sidewall. This pressure loosens or de-couples the mating between the raised portions and their corresponding grooves and ensures that removal does not occur inadvertently.

FIGS. 13A-14B provide an enlarged view of the second and third stages shown in FIGS. 12B and 12C. For clarity in the illustration, the housing panel component and device lid portion have been segmented into two portions (a rear portion and a forward portion). In FIGS. 13A and 13B, a rear portion of the housing panel component 200 and a rear portion of the lid portion 1200 are shown, and in FIGS. 14A and 14B, the remaining or corresponding forward portion of the housing panel component 200 and a forward portion of the lid portion 1200 are shown. Referring first to FIG. 13A, the rear portion of the housing panel component 200 has been slid, pressed, inserted, 'dropped', or otherwise conveyed onto the rear portion of the interface surface 660 of the receiving portion 620 with respect to the vertical axis 190. Each raised portion of the second set of raised portions protruding from the second sidewall has been introduced into their corresponding grooves. Specifically, in FIG. 13A, the first raised portion 310 has been received by the first groove 710, the second raised portion 320 has been received by the second groove 720, and the third raised portion 330 has been received by the third groove 730. At this time, although some of the connecting elements have been inserted into or made contact with their respective receptacles, the housing panel component 200 remains unsecure, and a gap 1300 between the fourth side surface 618 of the base portion 610 and the rearward 206 of the housing panel component 200 remains in which a portion of the interface surface 660 is exposed. In FIG. 13B, following a final push or gentle force applied to continue the attachment process, it can be observed that the three raised portions have been guided further into the groove, and moved a distance in a rearward direction along the lateral axis 170 into the respective securing segments of each of the grooves (see FIG. 9). Once this occurs, the raised portion is 'locked' in place, the housing panel component 200 has been fully fastened, and the two component remain mated, unless a force is applied to remove the housing panel component 200 from the device 600 (e.g., during an un-installment).

At the same time, referring to FIG. 14A, the forward portion of the housing panel component 200 is depicted slid, pressed, inserted, 'dropped', or otherwise conveyed onto the forward portion of the receiving portion 620. Each raised portion of the second set of raised portions protruding from the second sidewall has been guided into their corresponding grooves. Specifically, in FIG. 14A, the fourth raised portion 340 has been received by the fourth groove 740, the fifth raised portion 350 has been received by the fifth groove 750, and the sixth raised portion 360 has been received by the sixth groove 760. At this time, although some of the connecting elements have been inserted into or made contact with their respective receptacles, the housing panel component 200 remains unsecure or only partially installed. In FIG. 13B, following a final push or gentle force applied to continue the attachment process, it can be observed that the three raised portions have been guided further into the groove, and moved a distance in a rearward direction along the lateral axis 170 into the respective securing segments of each of the grooves (see FIG. 9). Once this occurs, the raised portion is 'locked' in place, the housing panel component 200 has been fully fastened, and the two component remain mated, unless a force is applied to remove the housing panel component 200 from the device 600 (e.g., during an un-installment). In some implementations, the flange portion 370 can also be received by the channel 770 which can help anchor the ledge portion 308 of the housing panel component 200. It is to be understood that while only the raised portions along one sidewall were illustrated for purposes of simplicity, the other connector elements (i.e., tab portions and recessed slots, protruding portions and apertures, and the raised portions of the opposing sidewall with their corresponding grooves), will also be joined together during this process, and secured as described herein. In other implementations, fewer types of fastening mechanism may be used than what is shown in the drawings. For example, in some implementations, a housing panel component may only include the raised portions, without the tab portions or the protruding portions. In another example, a housing panel component may not include the protruding portions. In some implementations, the tab portions and protruding portions may be included, while no raised portions are present. The device's receiving portion can be configured according to the desired connection mechanisms formed in the housing panel components.

Figure 15:
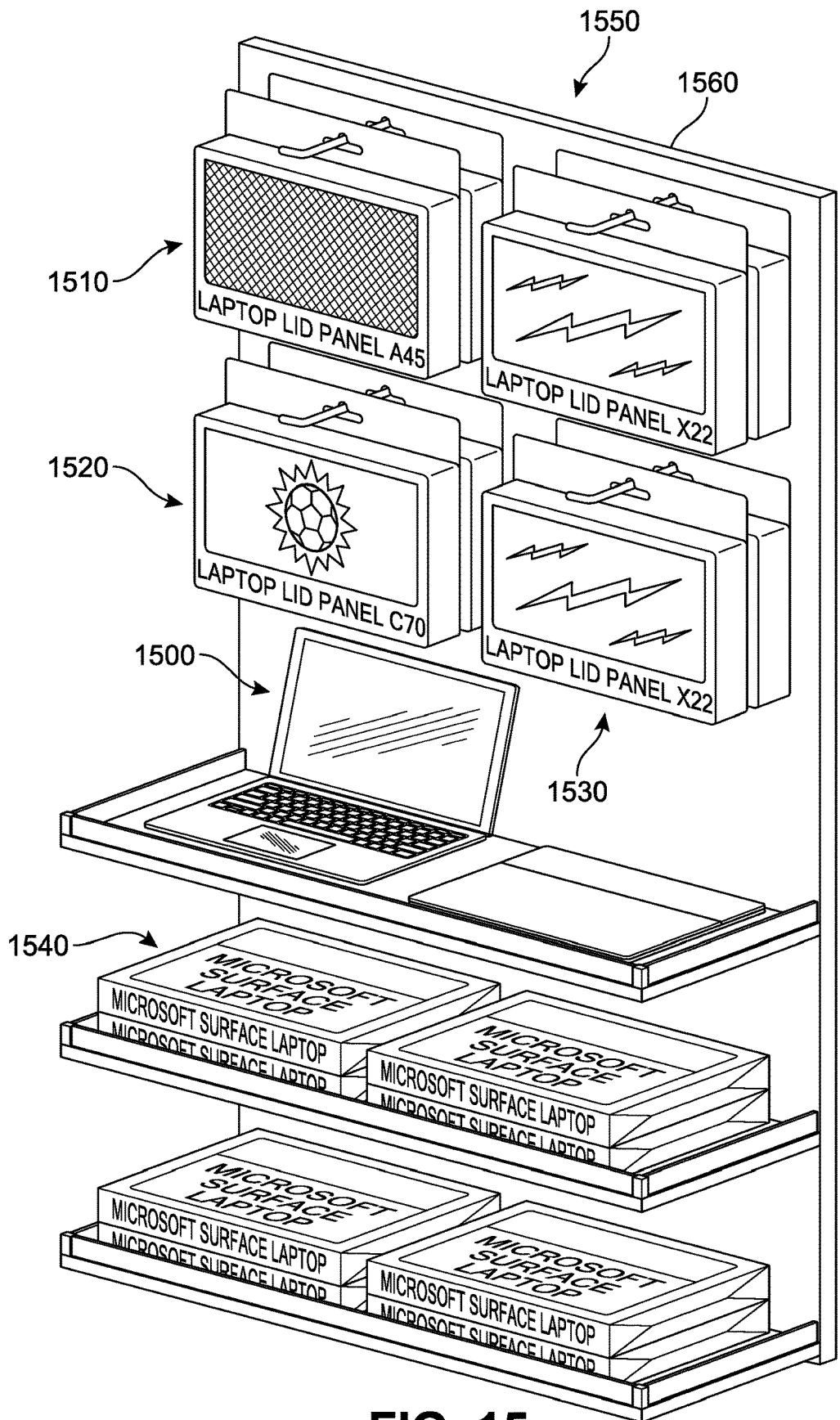
FIG. 15 is an isometric view of an example of a retail system.

Referring now to FIG. 15, one implementation of a retail system 1550 is depicted. In some implementations, portable computing devices 1540 are sold simultaneously with complementary pre-packaged interchangeable housing panel components of varying appearance and comprising varying materials. In this figure, the retail system 1550 is shown as part of a wall 1560. In different implementations, this wall 1560 would be a portion of a retail store or other sale place for merchandise. In other implementations of a retail system there may be no wall 1560, or the components may be displayed or offered by other means. The portable computing devices and associated components are shown generically in FIG. 15 only for the purpose of illustration. In some embodiments, the housing panel components may be different styles and colors. Each pre-packaged interchangeable housing panel component (here a first housing panel component 1510, a second housing panel component 1520, and a third housing panel component 1530) includes a ready-to-install housing panel component that reflects a particular design or appearance type.

In different implementations, using a retail system, a user could purchase a computing device, and select an additional housing panel component from the group of housing panel components that have been designed and pre-packaged as per their preference. By associating a housing panel component with a device, and attaching that housing panel component by the mechanisms described herein, the user may modify a device themselves, to provide varying appearance and texture types.

In some situations, it may be preferable for a user to purchase multiple pre-packaged housing panel components, such as first housing panel component 1510 and second housing panel component 1520, at one time. Using a retail system like the one illustrated in FIG. 15, a user could purchase a computing device 1500 and two or more pre-packaged housing panel components. This would permit the user to swap the housing panel components at desired occasions, and return the device to its original appearance at any time. Additionally, housing panel components can be easily portable in the sense that they are small compared to the size of the computing devices, which is already being transported by the user. This feature may allow the user to modify the appearance of the device at any time and at various locations and/or events.

FIG. 16 illustrates an isometric view of a kit of parts ("kit") 1650. In some implementations, the kit may comprise at least one computing device 1600, accessories for the computing device (here interchangeable components including a first housing panel component 1610 and a second, different housing panel component 1620), and/or a container 1640 for storing the device and accessories. In other implementations, kit could include any other provisions not discussed below including but not limited to: instructions, electrical connectors and cords, headsets, speakers, various kinds of media (such as CDs, DVDs, etc.), additional storage containers for storing device 1600 and/or device accessories as well as any other provisions. Generally, the device 1600 associated with the kit may be any type of computing device configured to accommodate the housing panel components described herein.

Kit 1650 may be offered for sale at a retail location, as discussed previously. Kit may also be offered for sale at a kiosk, factory outlet, manufacturing store, and/or through an online vendor. In some implementations, the various parts of kit are sold together. In other implementations, some parts of kit may be sold separately. As an example, the current implementation of FIG. 16 depicts kit of parts 1650 including container 1640, computing device 1600, first housing panel component 1610, and second housing panel component 1620. In other embodiments, a retailer could sell a kit including device 1600 and only one housing panel component. In other cases, a retailer could sell a kit including device 1600 and three or more housing panel components. In other implementations, the retailer could sell one or more other housing panel components separately from the kit.

Furthermore, kit 1650 may include container 1600. Container 1600 can be any type of container configured to store computing device and accessories. In some embodiments, container 1600 may be a box. In one embodiment, container 1600 may be a carrying case that is configured to transport the computing device and accessories. In some embodiments, container 1600 may have a generally rectangular shape, and can include a lower portion and a lid. In other embodiments, container 1600 could be a bag, sack, or other type of container. In other embodiments, the various items in the kit may not be provided in a container 1600.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. An interchangeable housing component for a portable computing device, the component comprising:
   a body portion including:
     an upper surface,
     an opposite-facing lower surface, and
     a forward edge, a rearward edge, a first side edge, and a second side edge;
   a first sidewall extending outward from the first side edge of the body portion, and a second sidewall extending outward from the second side edge of the body portion; and
   a first set of raised portions protruding from a first interior surface of the first sidewall, and a second set of raised portions protruding from a second interior surface of the second sidewall, wherein the first interior surface and the second interior surface face toward one another, and two or more of the raised portions of the first set of raised portions differ in three-dimensional shape.

2. The interchangeable housing component of claim 1, wherein the first set of raised portions includes a first raised portion having a substantially trapezoidal cross-sectional shape along a lateral plane.

3. The interchangeable housing component of claim 1, wherein the first set of raised portions includes at least three raised portions.

4. The interchangeable housing component of claim 1, wherein the first set of raised portions include three raised portions that are positioned at a first height relative to the first sidewall and three raised portions that are positioned at a second height relative to the first sidewall, wherein the first height is greater than the second height.

5. The interchangeable housing component of claim 1, wherein the first set of raised portions and the second set of raised portions are disposed in a substantially symmetrical arrangement relative to a midline of the body portion.

6. The interchangeable housing component of claim 1, wherein the first set of raised portions includes a first raised portion and a second raised portion, the first raised portion has a first width, and the second raised portion has a second width that is greater than the first width.

7. The interchangeable housing component of claim 1, wherein the body portion includes a first material, the first sidewall includes a second material, and the first material differs from the second material.

8. The interchangeable housing component of claim 1, further comprising a third sidewall extending outward from the forward edge of the body portion, the third sidewall being disposed between the first sidewall and the second sidewall.

9. The interchangeable housing component of claim 8, wherein the first sidewall, the second sidewall, and the third sidewall are joined to form a substantially continuous U-shaped sidewall.

10. The interchangeable housing component of claim 8, further comprising a group of protruding portions extending proximally inward from a third interior surface of the third sidewall.

11. The interchangeable housing component of claim 1, further comprising a plurality of tab portions extending distally outward from the rearward edge of the body portion.

12. The interchangeable housing component of claim 11, wherein the plurality of tab portions include a first tab portion that is aligned with a first horizontal plane, the body portion is aligned with a second horizontal plane, and the second horizontal plane is offset relative to the first horizontal plane.

13. The interchangeable housing component of claim 11, wherein the plurality of tab portions include a first tab portion having a substantially rectangular cross-sectional shape along a horizontal plane.

14. The interchangeable housing component of claim 11, wherein each tab portion of the plurality of tab portions has a substantially similar three-dimensional shape.

15. The interchangeable housing component of claim 1, wherein the body portion includes a first layer associated with the upper surface and a second layer associated with the lower surface, and wherein materials comprising the first layer differ from materials comprising the second layer.

16. The interchangeable housing component of claim 1, wherein the upper surface and the lower surface of the body portion are integrally formed and comprised of a substantially similar material.

17. A modular lid system for a portable computing device, the system comprising:
- a display housing of the portable computing device comprising a first side and an opposite-facing second side, the first side including a base portion and a receiving portion that is recessed relative to the base portion, the second side including a display panel; and
- the interchangeable housing component of claim 1.

18. The modular lid system of claim 17, wherein the receiving portion includes a first set of grooves arranged to receive each of the raised portions of the first set of raised portions when the interchangeable housing component is joined to the display housing.

19. The modular lid system of claim 17, wherein installation of the interchangeable housing component results in a substantially continuous exterior surface of the first side of the display housing, and the interchangeable housing component represents approximately ⅔ of a total surface area of the exterior surface.

20. A kit of parts comprising:
- a portable computing device with a display housing comprising a first side and an opposite-facing second side, the first side including a base portion and a receiving portion that is recessed relative to the base portion, the second side including a display panel; and
- a first interchangeable housing component sized and dimensioned to be removably attached to the receiving portion, the first interchangeable housing component including a body portion with an upper surface and an opposite-facing lower surface, a U-shape sidewall extending around three sides of the body portion, and a set of raised portions protruding from an interior surface of a portion of the U-shape sidewall extending around one of the three sides of the body portion;
- wherein the receiving portion includes an interface surface that is exposed until the first interchangeable housing component is removably attached to the display housing, and two or more raised portions of the set of raised portions differ in three-dimensional shape.

21. The kit of parts of claim 20, wherein the upper surface of the first housing interchangeable component is flush and level with respect to an outermost surface of the base portion when the first interchangeable housing component is attached to the display housing.

22. The kit of parts of claim 20, further comprising a second interchangeable housing component sized and dimensioned to be removably attached to the receiving portion, the second interchangeable housing component including an upper surface and an opposite-facing lower surface, and wherein:
- the upper surface of the first interchangeable housing component includes a first material, and the upper surface of the second interchangeable housing component includes a second material that differs from the first material.

23. The kit of parts of claim 22, wherein the lower surface of the first interchangeable housing component includes a third material, and the lower surface of the second interchangeable housing component includes a fourth material that is the same as the third material.

24. The kit of parts of claim 22, wherein the first material includes a smooth, rigid outer surface and the second material includes a textured, compressible outer surface.

25. The kit of parts of claim 20, wherein a difference in height along a vertical axis between the base portion and the receiving portion is less than or equal to a thickness of the body portion.

* * * * *